(12) United States Patent
Qi et al.

(10) Patent No.: US 10,975,498 B2
(45) Date of Patent: Apr. 13, 2021

(54) SYSTEM BASED ON LOW-PRESSURE CHEMICAL VAPOR DEPOSITION FOR FABRICATING PEROVSKITE FILM FROM ORGANIC HALIDE COMPOUND AND METAL HALIDE COMPOUND

(71) Applicant: OKINAWA INSTITUTE OF SCIENCE AND TECHNOLOGY SCHOOL CORPORATION, Okinawa (JP)

(72) Inventors: Yabing Qi, Kunigami-gun (JP); Matthew Ryan Leyden, Kunigami-gun (JP)

(73) Assignee: OKINAWA INSTITUTE OF SCIENCE AND TECHNOLOGY SCHOOL CORPORATION, Okinawa (JP)

( * ) Notice: Subject to any disclaimer, the term of this patent is extended or adjusted under 35 U.S.C. 154(b) by 228 days.

(21) Appl. No.: 15/503,780

(22) PCT Filed: Aug. 17, 2015

(86) PCT No.: PCT/JP2015/004078
§ 371 (c)(1),
(2) Date: Feb. 14, 2017

(87) PCT Pub. No.: WO2016/027450
PCT Pub. Date: Feb. 25, 2016

(65) Prior Publication Data
US 2017/0268128 A1 Sep. 21, 2017

Related U.S. Application Data

(60) Provisional application No. 62/040,302, filed on Aug. 21, 2014.

(51) Int. Cl.
*C30B 31/16* (2006.01)
*C23C 16/448* (2006.01)
(Continued)

(52) U.S. Cl.
CPC .............. *C30B 31/16* (2013.01); *C23C 16/30* (2013.01); *C23C 16/448* (2013.01); *C23C 16/52* (2013.01);
(Continued)

(58) Field of Classification Search
CPC ......... C30B 23/00; C30B 23/02; C30B 23/06; C30B 23/063; C30B 23/066; C30B 29/00;
(Continued)

(56) References Cited

U.S. PATENT DOCUMENTS 5,199,994 A * 4/1993 Aoki ....................... C30B 31/00
118/715
5,769,942 A * 6/1998 Maeda .................... C30B 25/22
117/107
(Continued)

FOREIGN PATENT DOCUMENTS

CN 104485425 A 4/2015
JP 8-97159 A 4/1996
(Continued)

OTHER PUBLICATIONS

Chen, et al. publication entitled "Planar heterojunction perovskite solar cells via vapor-assisted solution process," Journal of the American Chemical Society, vol. 136, pp. 622-625 (2014) (Year: 2013).*
(Continued)

*Primary Examiner* — Kenneth A Bratland, Jr.
(74) *Attorney, Agent, or Firm* — Westerman, Hattori, Daniels & Adrian, LLP

(57) ABSTRACT

A system and method for fabricating a perovskite film is provided, the system including a housing for use as a CVD
(Continued)

furnace having first and second sections coupled with first and second temperature control units, respectively. The first and second sections correspond substantially to the upstream and downstream of gases, respectively. One or more substrates are loaded in the second section and controlled by the second temperature control unit, and an evaporation unit containing an organic halide material is loaded in the first section and controlled by the first temperature control unit. Each of the substrates is pre-deposited with a metal halide material. The inside of the housing is pumped down to a low pressure.

12 Claims, 18 Drawing Sheets

(51) Int. Cl.

| | | |
|---|---|---|
| *H01L 33/00* | (2010.01) | |
| *H01L 33/26* | (2010.01) | |
| *C23C 16/30* | (2006.01) | |
| *C30B 25/02* | (2006.01) | |
| *C30B 29/12* | (2006.01) | |
| *C30B 25/00* | (2006.01) | |
| *C30B 31/12* | (2006.01) | |
| *C23C 16/52* | (2006.01) | |
| *C30B 29/54* | (2006.01) | |
| *H01L 51/00* | (2006.01) | |
| *H01L 51/42* | (2006.01) | |
| *H01G 9/20* | (2006.01) | |
| *H01L 51/50* | (2006.01) | |

(52) U.S. Cl.
CPC .............. *C30B 25/00* (2013.01); *C30B 25/02* (2013.01); *C30B 29/12* (2013.01); *C30B 29/54* (2013.01); *C30B 31/12* (2013.01); *H01L 33/005* (2013.01); *H01L 33/26* (2013.01); *H01L 51/001* (2013.01); *H01L 51/002* (2013.01); *H01G 9/2009* (2013.01); *H01L 51/4226* (2013.01); *H01L 51/5012* (2013.01)

(58) Field of Classification Search
CPC ......... C30B 29/10; C30B 29/52; C30B 29/54; C30B 25/00; C30B 25/02; C30B 25/10; C30B 25/16; C30B 25/165; C30B 31/00; C30B 31/06; C30B 31/12; C30B 31/16; C23C 16/30; C23C 16/448; C23C 16/52; H01L 33/005; H01L 33/26; H01L 51/001; H01L 51/002; H01L 51/4226; H01L 51/5012; H01G 9/2009
USPC ....... 117/84, 88, 91, 99, 104, 200, 204, 925, 117/937, 940
See application file for complete search history.

(56) References Cited

U.S. PATENT DOCUMENTS

| | | | |
|---|---|---|---|
| 5,871,579 | A | 2/1999 | Liang et al. |
| 6,420,056 | B1 | 7/2002 | Chondroudis et al. |
| 6,893,498 | B1 | 5/2005 | Miller et al. |
| 2007/0101932 | A1* | 5/2007 | Schowalter ........... C30B 11/003 117/84 |
| 2007/0151509 | A1* | 7/2007 | Park .................... C01B 21/0602 117/200 |
| 2009/0291549 | A1 | 11/2009 | Yamasaki et al. |

FOREIGN PATENT DOCUMENTS

| | | |
|---|---|---|
| JP | 2001-60497 A | 3/2001 |
| JP | 2003-253443 A | 9/2003 |
| JP | 2007-165788 A | 6/2007 |
| JP | 2014-78392 A | 5/2014 |
| WO | 2014/045021 A1 | 3/2014 |
| WO | 2014/202965 A1 | 12/2014 |
| WO | 2015/170445 A1 | 11/2015 |
| WO | 2016/021112 A1 | 2/2016 |

OTHER PUBLICATIONS

Chen, et al. publication entitled "Planar heterojunction perovskite solar cells via vapor-assisted solution process," Journal of the American Chemical Society, vol. 136, pp. 622-625 (2013). (Year: 2013).*
Office Action dated Oct. 30, 2017, issued in counterpart Korean Application No. 10-2017-7004274, with English translation. (12 pages).
First Examination Report dated Feb. 5, 2018, issued in counterpart Australian Application No. 2015304774. (4 pages).
Burschka et al., "Sequential deposition as a route to high-performance perovskite-sensitized solar cells," Nature 12340, vol. 499, Jul. 18, 2013, pp. 316-320, cited in the specification (5 pages).
Eperon et al., "Morphological Control for High Performance, Solution Processed Planar Heterojunction Perovskite Solar Cells," Advanced Functional Materials, vol. 24, Sep. 9, 2013, pp. 151-157, cited in ISR (7 pages).
Liu et al., "Efficient planar heterojunction perovskite solar cells by vapour deposition," Nature 12509, 2013, cited in the specification (8 pages).
Park, "Organometal Perovskite Light Absorbers Toward a 20% Efficiency Low-Cost Solid-State Mesoscopic Solar Cell," The Journal of Physical Chemistry Letters, Apr. 2013, pp. 2423-2429, cited in the specification (7 pages).
Colella et al., "MAPbI3-xClx Mixed Halide Perovskite for Hybrid Solar Cells: The Role of Chloride as Dopant on the Transport and Structural Properties", Chemistry of Materials, vol. 25, Oct. 21, 2013, pp. 4613-4618, cited in ISR (6 pages).
Chen et al., "Planar Heterojunction Perovskite Solar Cells via Vapor-Assisted Solution Process," Journal of the American Chemical Society, vol. 136, 2014, pp. 622-625 and Supporting Information, cited in the specification and ISR (8 pages).
Eperon et al., "Formamidinium lead trihalide: a broadly tunable perovskite for efficient planar heterojunction solar cells," Energy & Environmental Science, vol. 7, 2014, pp. 982-988, cited in the specification (7 pages).
Frost et al., "Atomistic Origins of High-Performance in Hybrid Halide Perovskite Solar Cells," Nano Letters, vol. 14, Mar. 31, 2014, pp. 2584-2590, cited in ISR (7 pages).
Leyden et al., "High performance perovskite solar cells by hybrid chemical vapor deposition," Journal of Materials Chemistry A, vol. 2, Sep. 24, 2014, pp. 18742-18745, cited in ISR (6 pages).
Tan et al., "Bright light-emitting diodes based on organometal halide perovskite," Nature Nanotechnology, vol. 9, Sep. 2014, pp. 687-692, cited in the specification (6 pages).
Xing et al., "Low-temperature solution-processed wavelength-tunable perovskites for lasing," Nature Materials, Mar. 2014, cited in the specification (5 pages).
Leyden et al., "Large formamidinium lead trihalide perovskite solar cells using chemical vapor deposition with high reproducibility and tunable chlorine concentrations," Journal of Materials Chemistry A, vol. 3, Jun. 29, 2015, pp. 16097-16103, cited in ISR (9 pages).
Luo et al., "Uniform, Stable, and Efficient Planar-Heterojunction Perovskite Solar cells by Facile Low-Pressure Chemicacl Vapor Deposition under Fully Open-Air Conditions," Applied Materials & Interfaces, vol. 7, Jan. 12, 2015, pp. 2708-2714, cited in ISR (7 pages).
International Search Report dated Oct. 27, 2015, issued in counterpart International Application No. PCT/JP2015/004078 (4 pages).
Written Opinion dated Oct. 27, 2015, issued in counterpart International Application No. PCT/JP2015/004078 (6 pages).
Lewis, D. et al, "Ambient Pressure Aerosol-Assisted Chemical Vapour Deposition of (CH3NH3)PbBr3, an Inorganic-Organic

(56) References Cited

OTHER PUBLICATIONS

Perovskite Important in Photovoltaics", Chemical Communications, May 2014, vol. 50, No. 48, pp. 6319-6321.
Extended (supplementary) European Search Report dated May 31, 2017, issued in counterpart European Application 15834500.9. (10 pages).
Office Action, dated Jul. 12, 2018, issued in counterpart Chinese patent application No. 201580044633.5 (w/ English translation; 13 pages).
Office Action, dated Feb. 26, 2019, issued in counterpart Chinese patent application No. 201580044633.5 (w/ English translation; 12 pages).
Office Action, dated May 28, 2019, issued in counterpart Japanese patent application No. 2017-509804 (w/ English translation; 14 pages).
First Examination Report, dated Nov. 8, 2019, issued in counterpart Indian Patent Application No. 201717004951 (w/ English translation; 6 pages).

* cited by examiner

[Fig. 1]
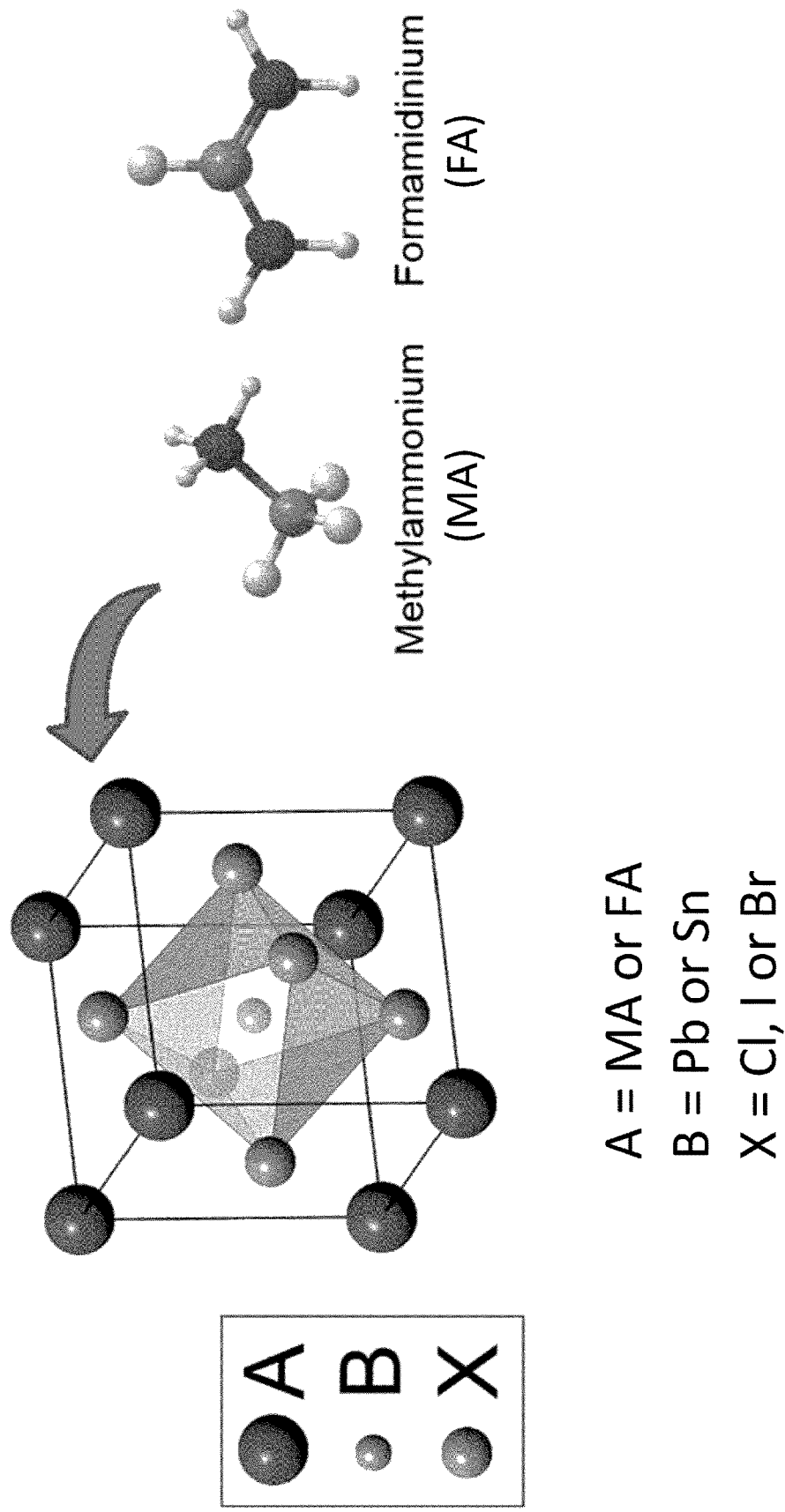

[Fig. 2]
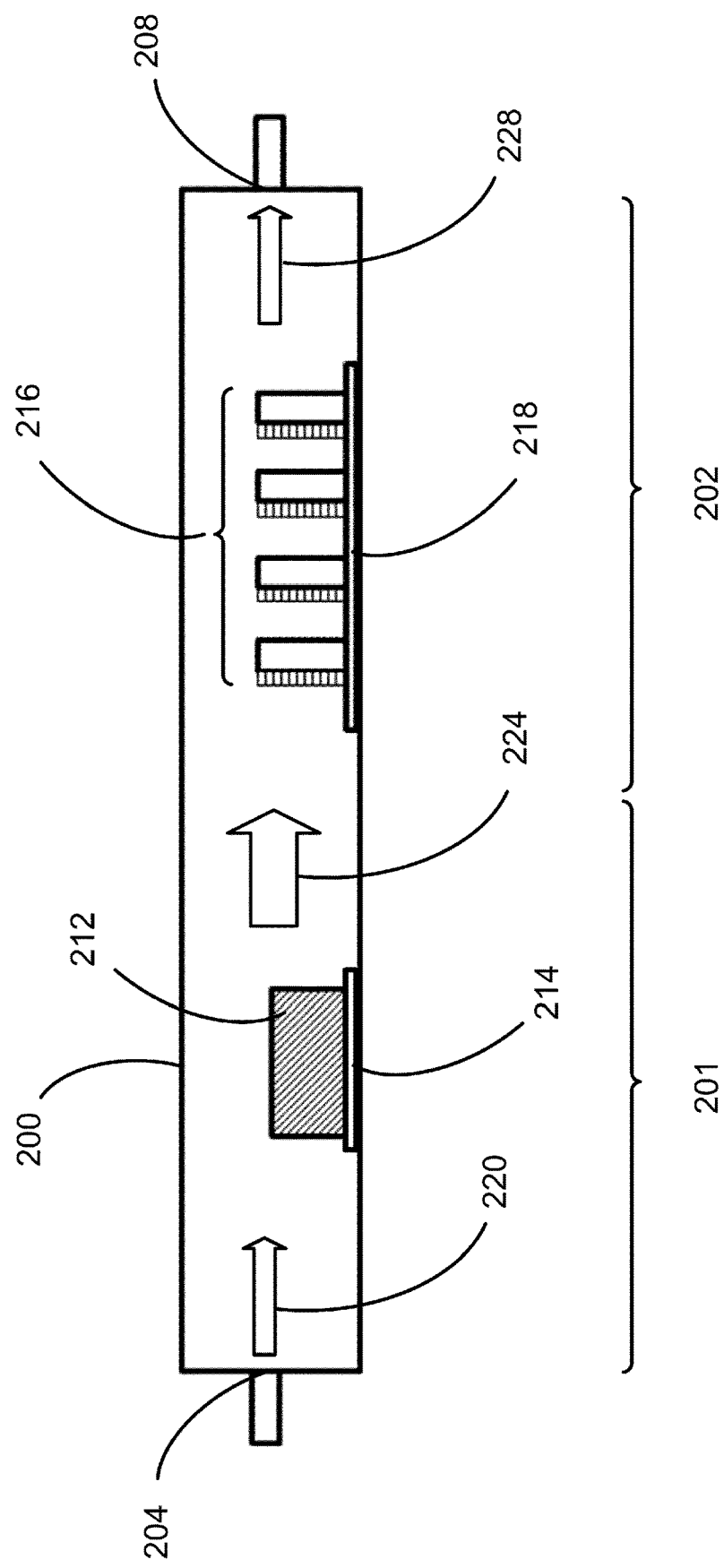

[Fig. 3]
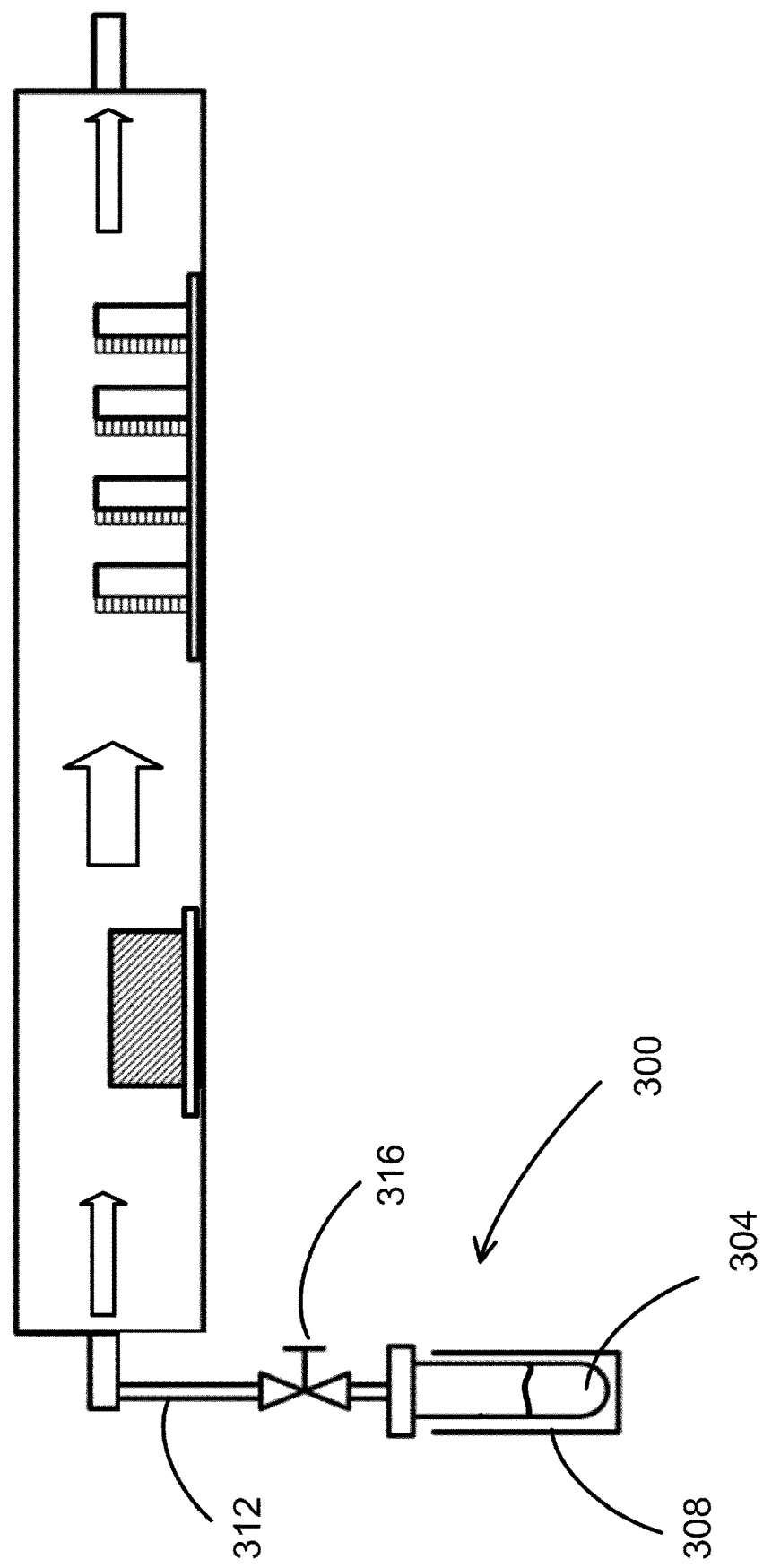

[Fig. 4]
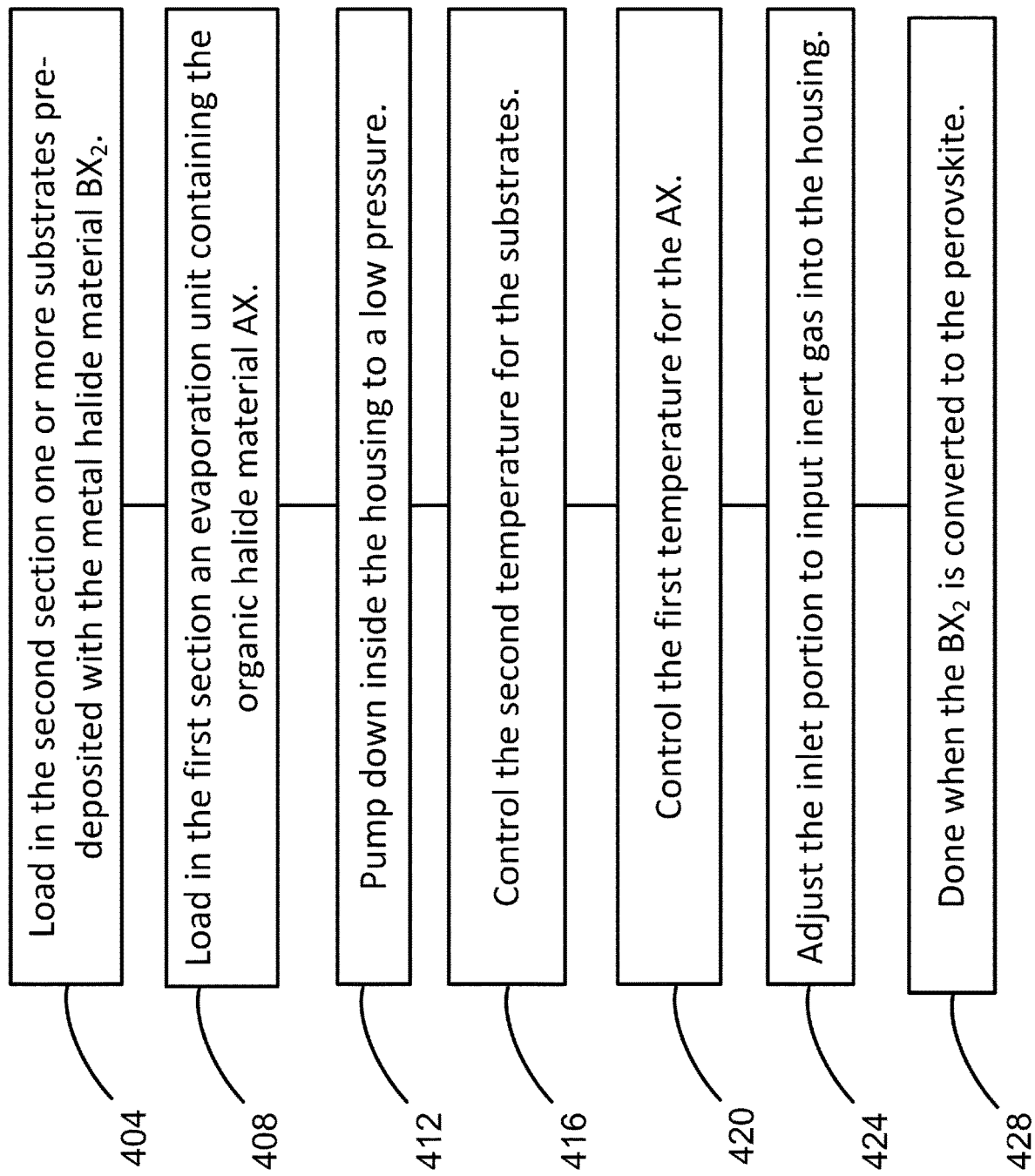

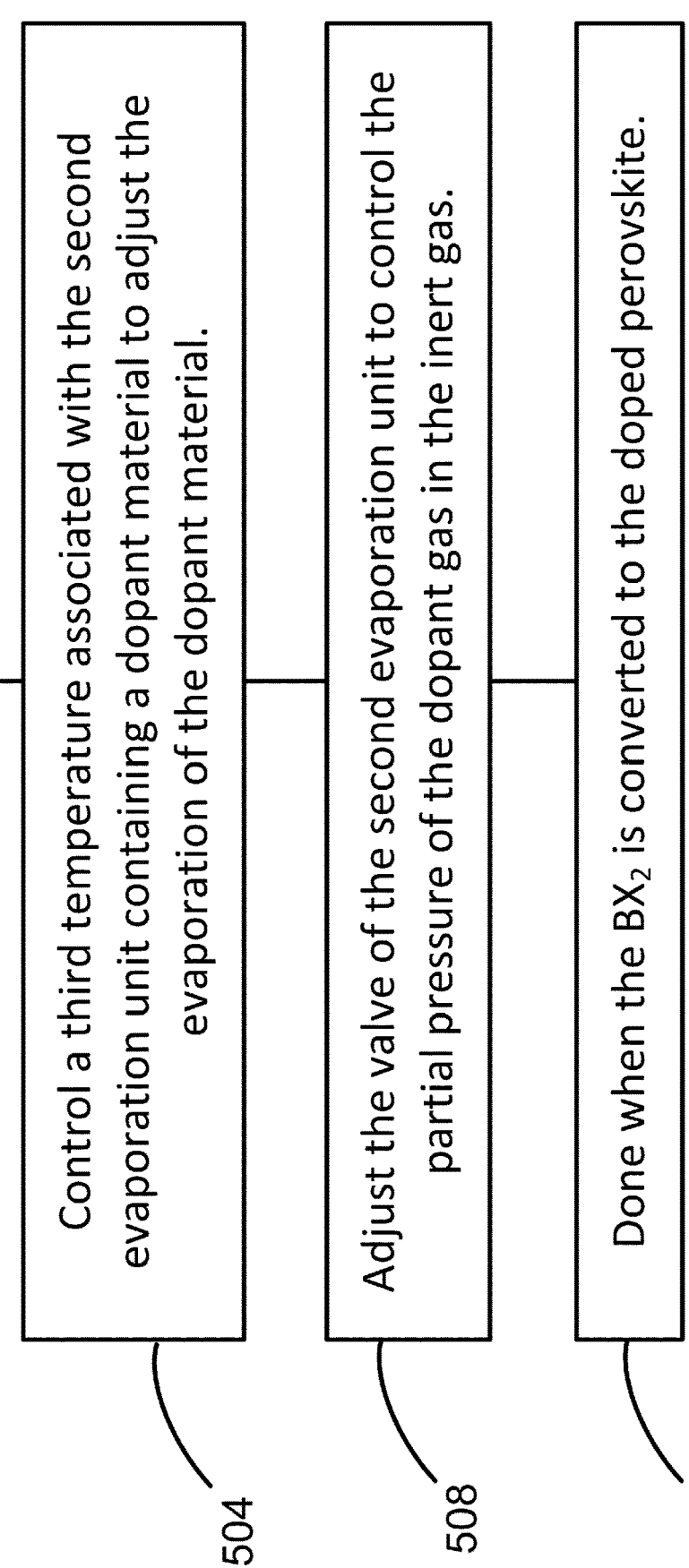
[Fig. 5]

[Fig. 6]
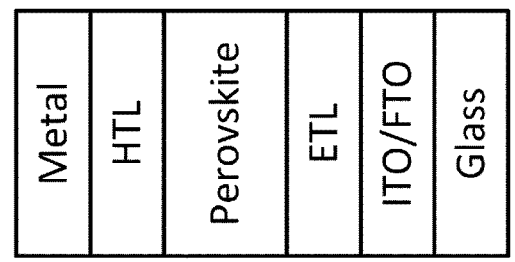
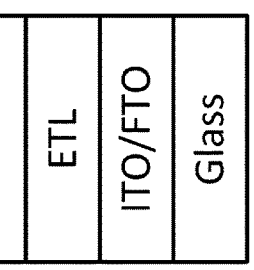
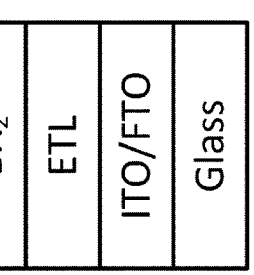
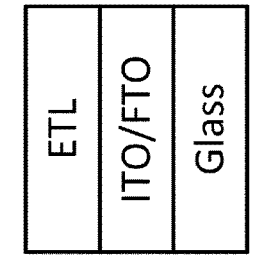

[Fig. 7]
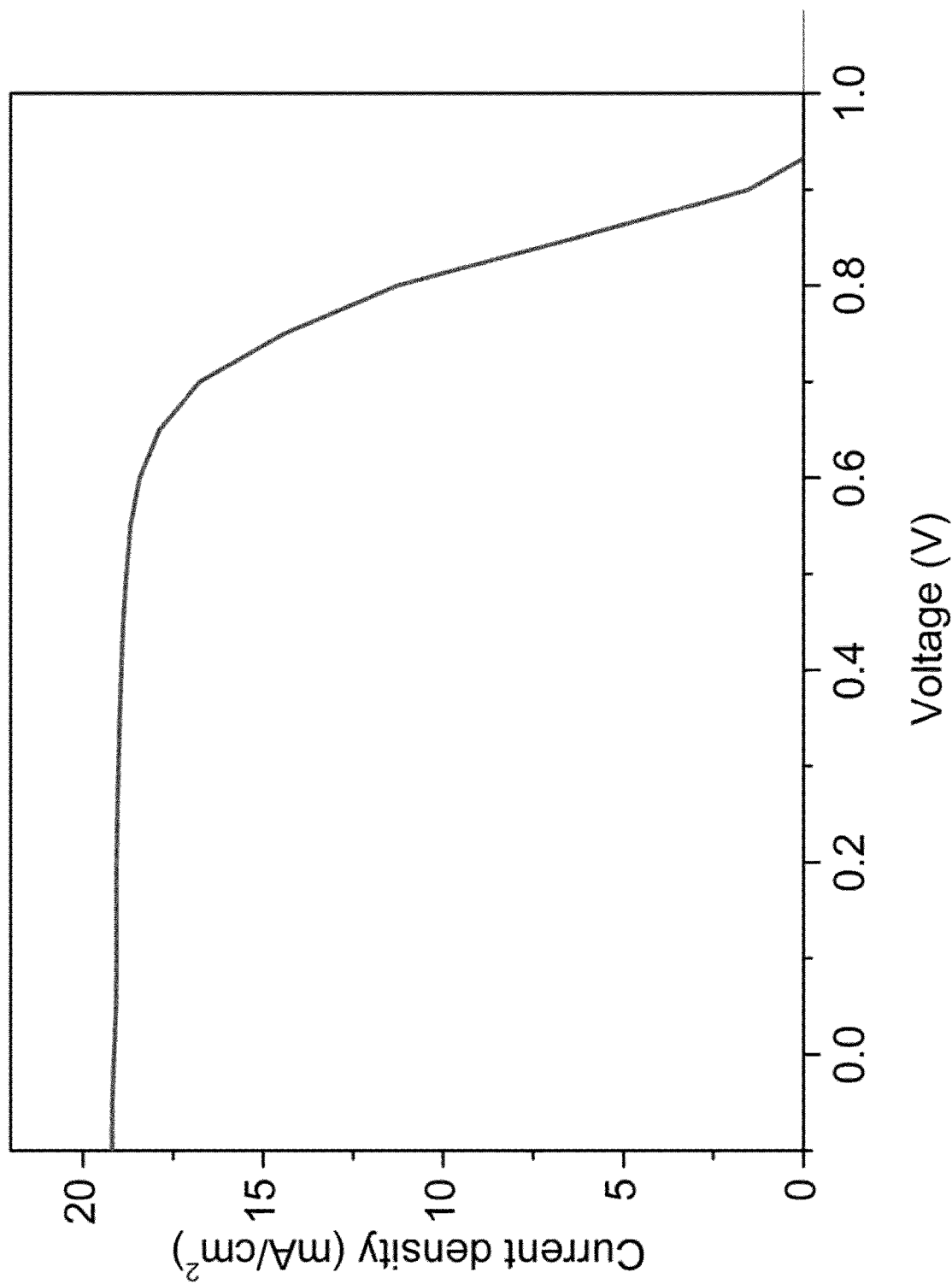

[Fig. 8]
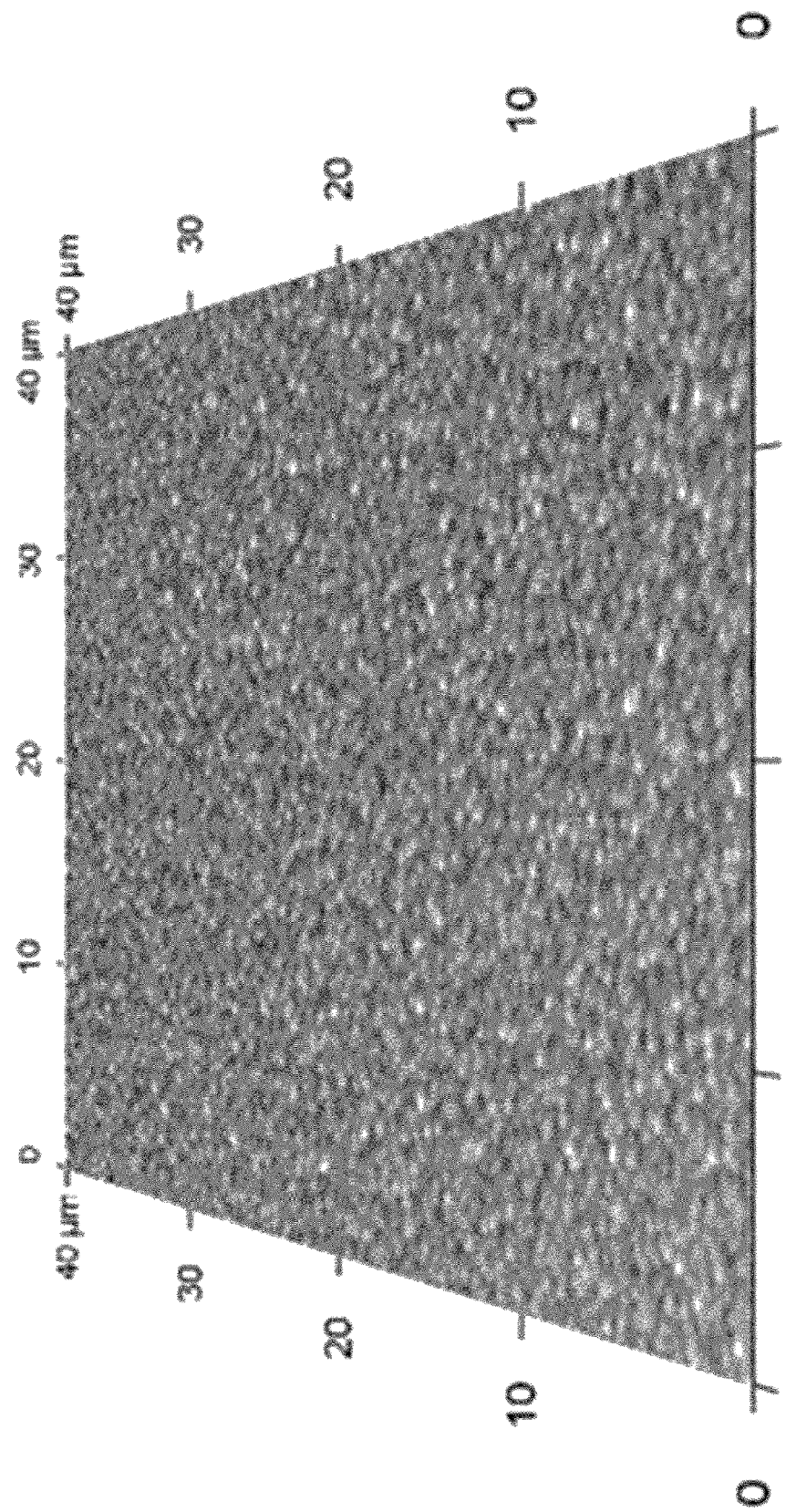

[Fig. 9]
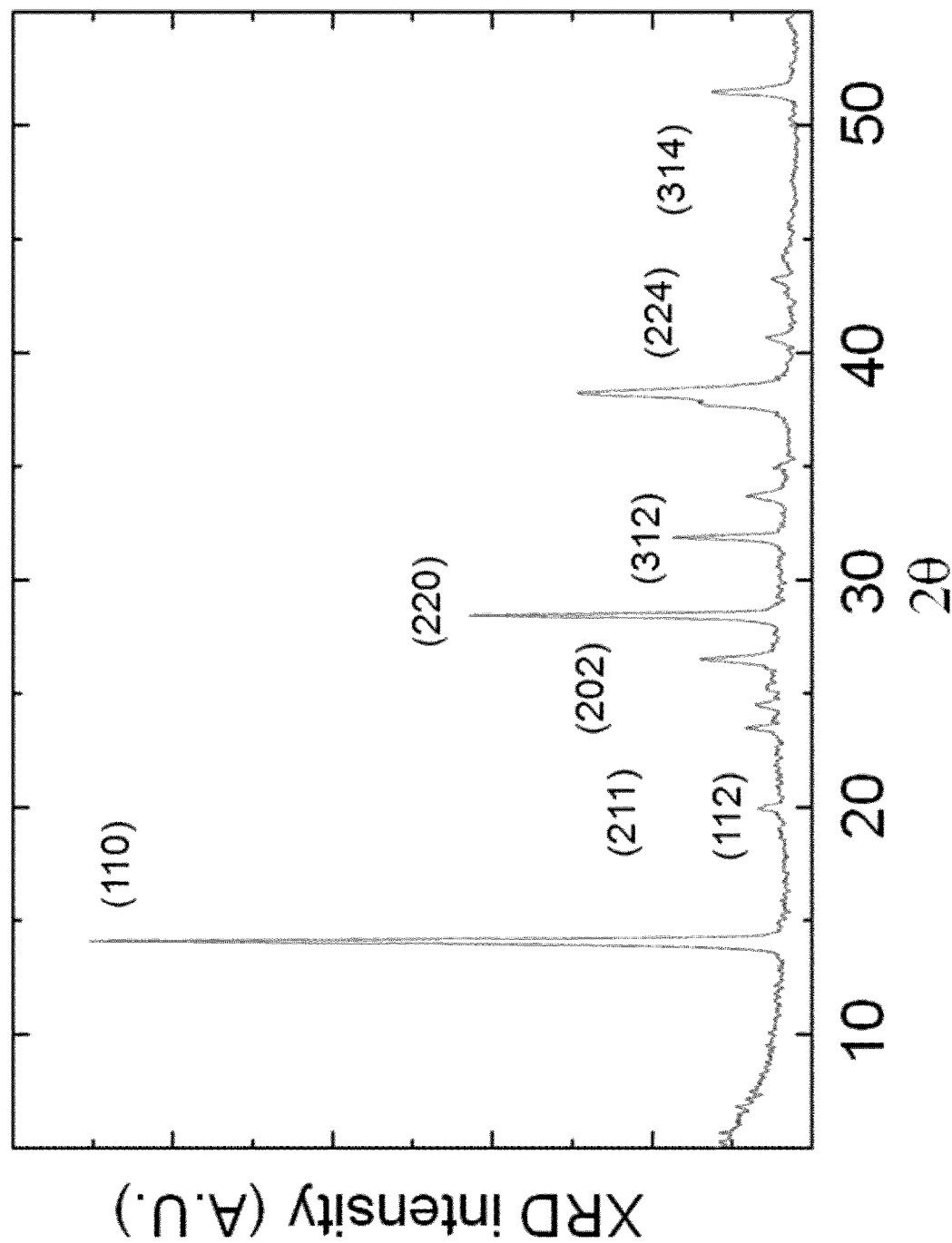

[Fig. 10]
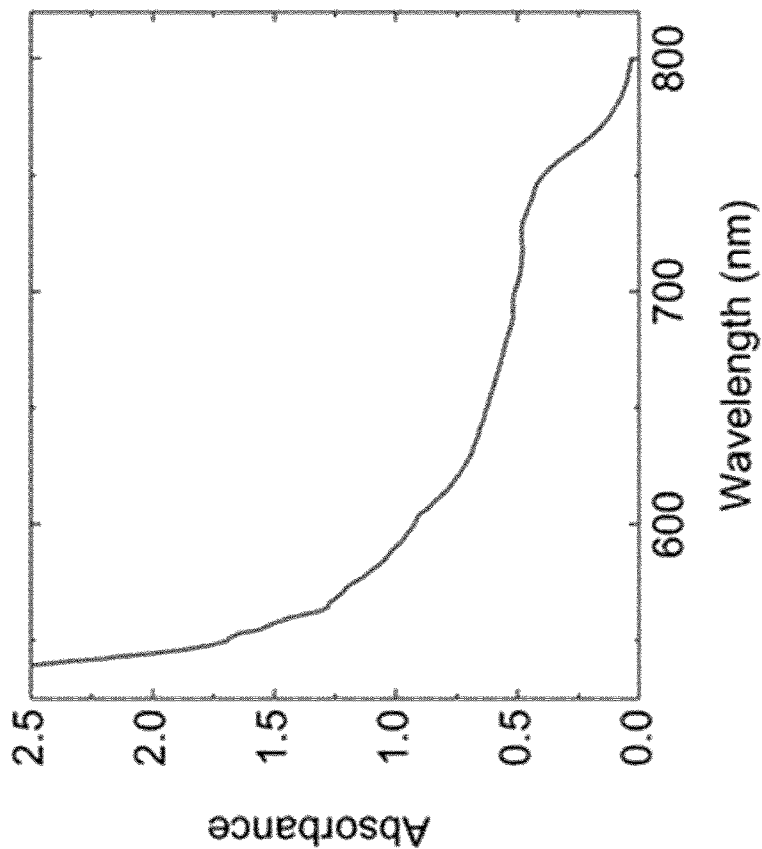
(B)
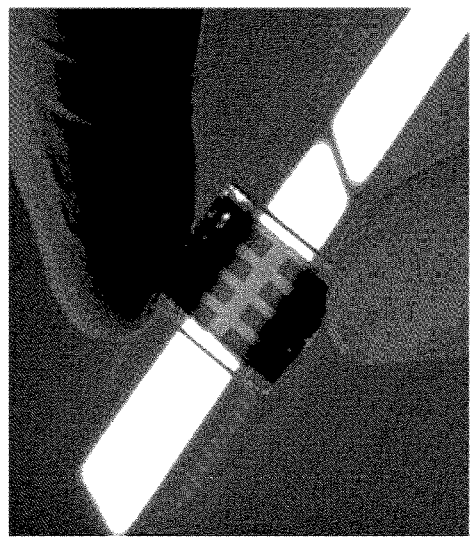
(A)

[Fig. 11]

[Fig. 12]
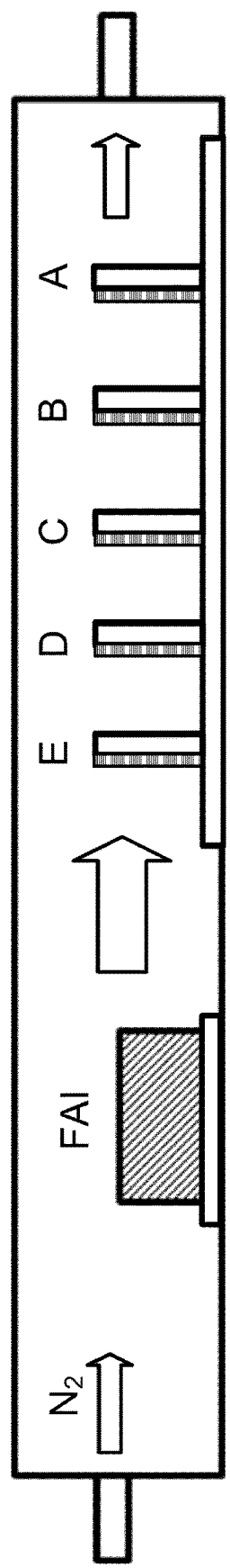

[Fig. 13]
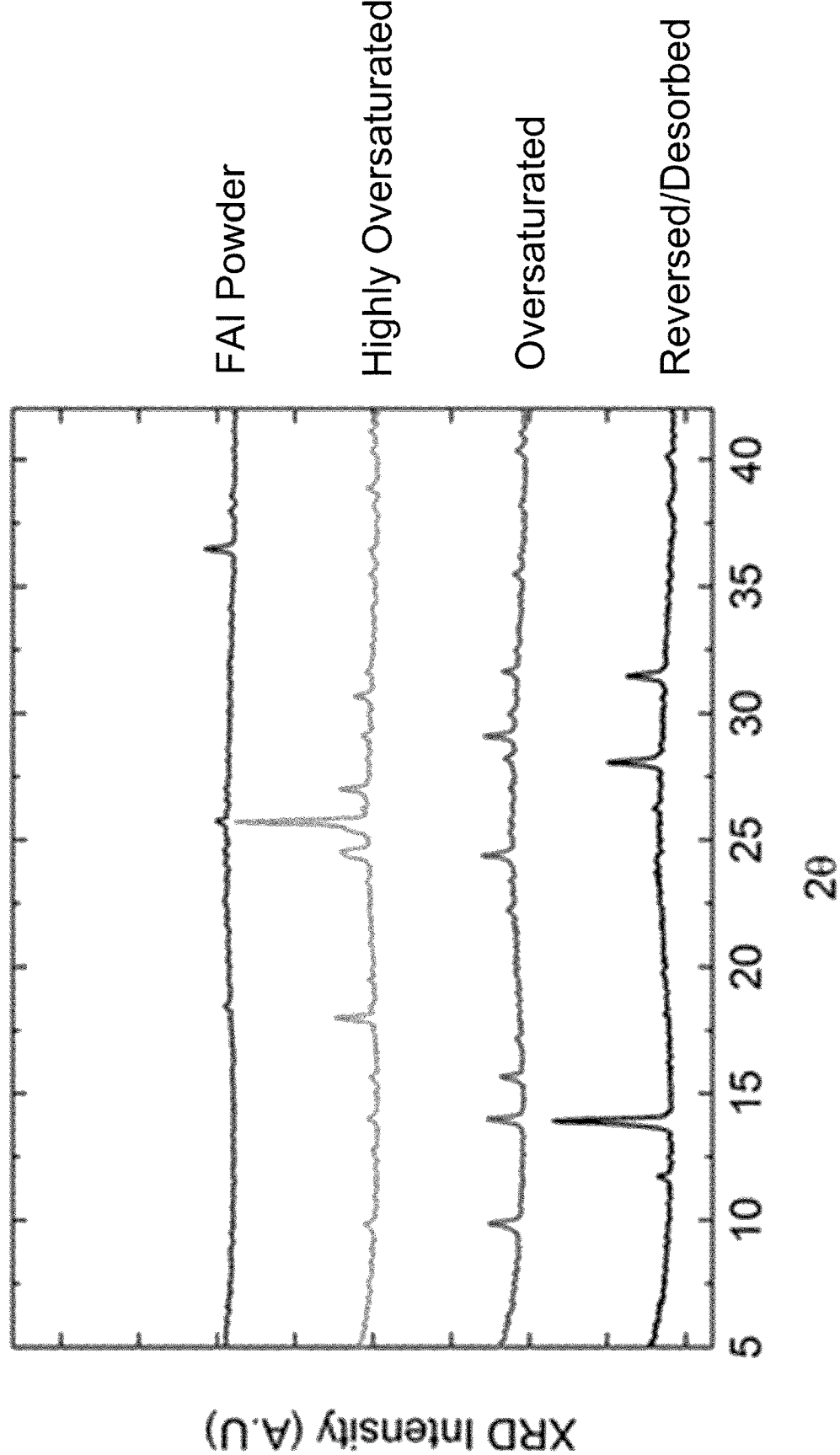

[Fig. 14]
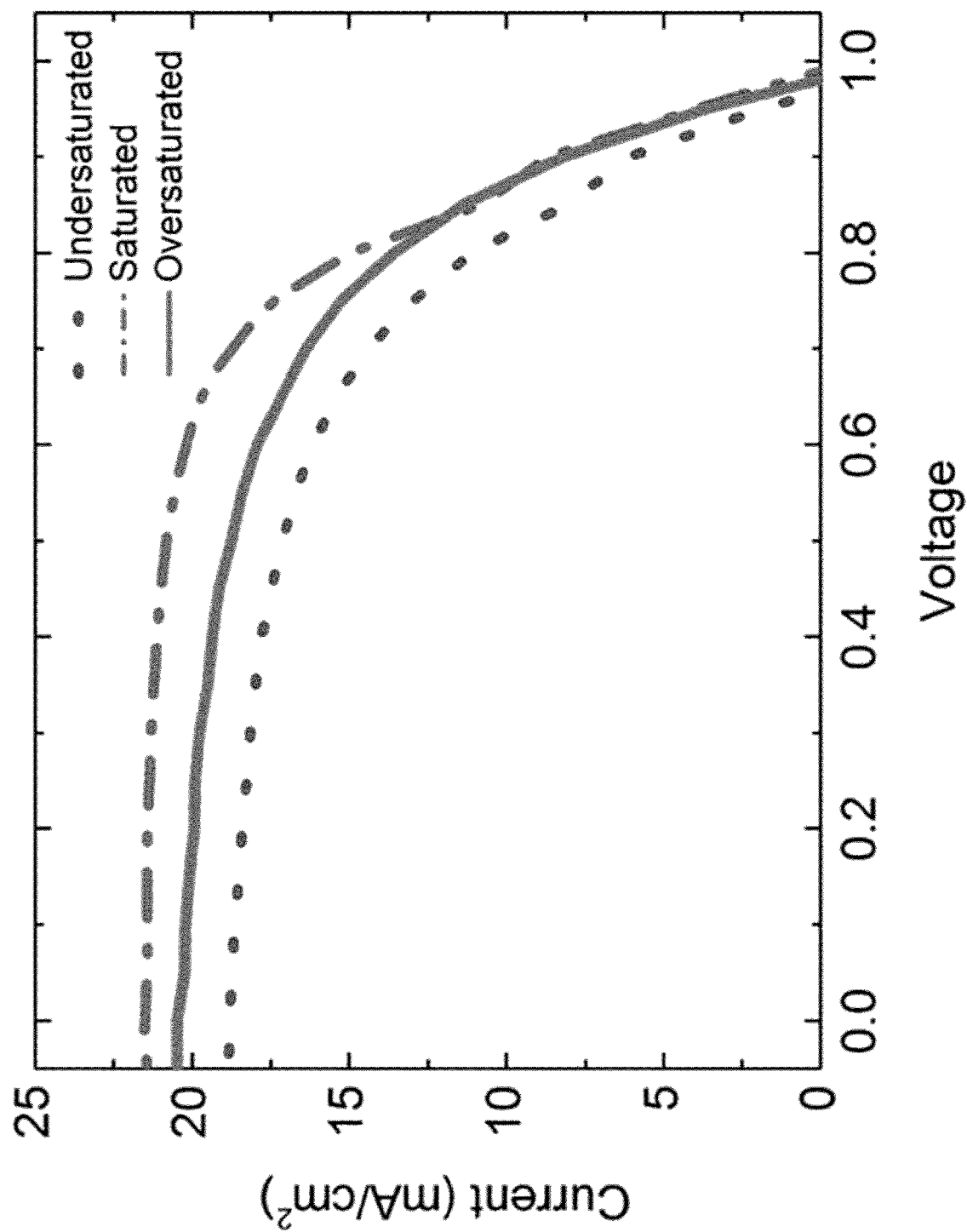

[Fig. 15]

Structure A

| Au |
|---|
| F8 |
| Perovskite |
| TiO$_2$ |
| FTO/ITO |

[Fig. 16]

Structure B

| Au |
| :---: |
| F8 |
| Perovskite with mesoporous alumina |
| TiO$_2$ |
| FTO/ITO |

[Fig. 17]
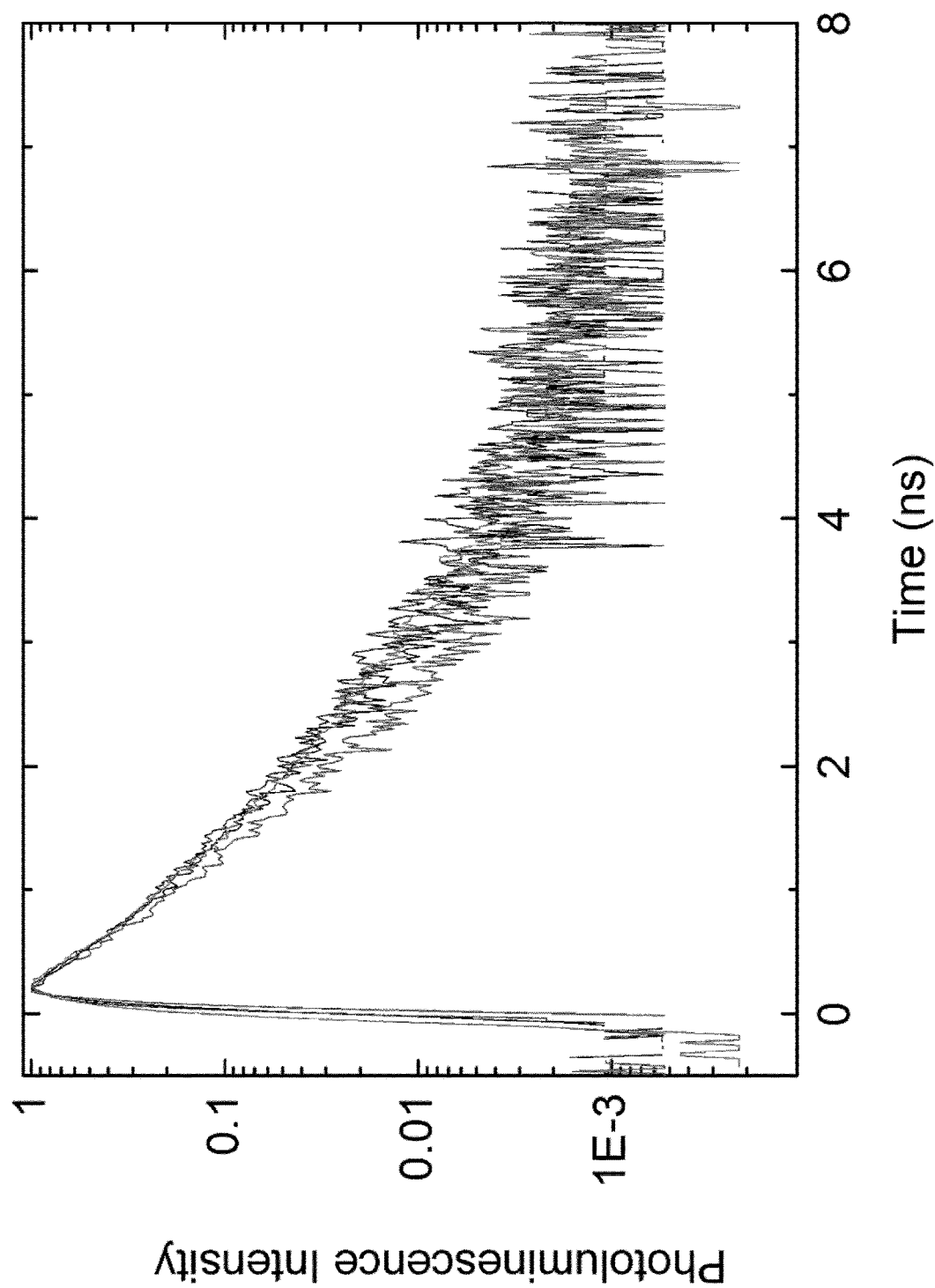

[Fig. 18]
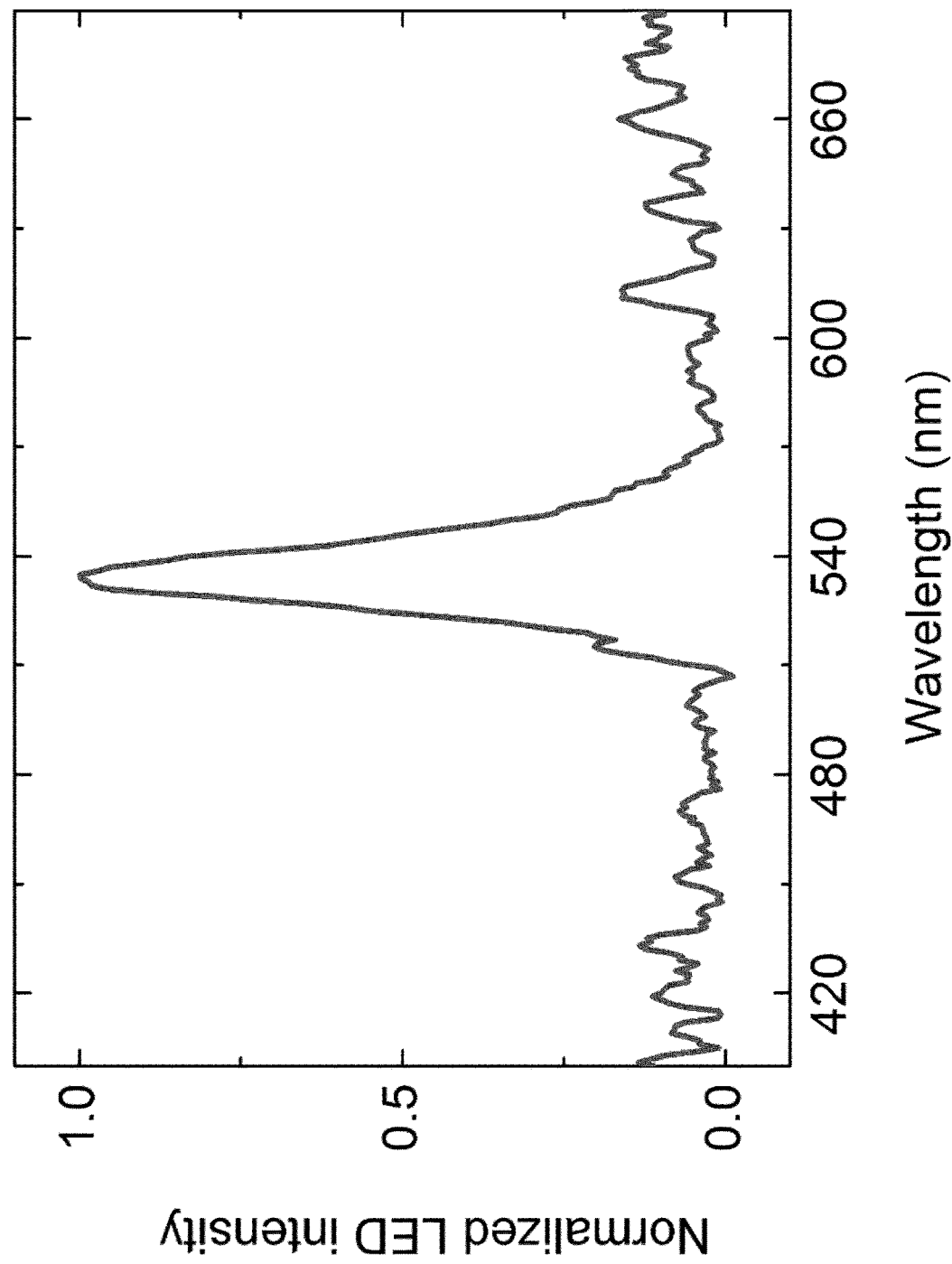

SYSTEM BASED ON LOW-PRESSURE CHEMICAL VAPOR DEPOSITION FOR FABRICATING PEROVSKITE FILM FROM ORGANIC HALIDE COMPOUND AND METAL HALIDE COMPOUND

TECHNICAL FIELD

The present invention relates to a system and method based on low-pressure chemical vapor deposition for fabricating perovskite films.

BACKGROUND ART

A solar cell (also called a photovoltaic cell) is an electrical device that converts solar energy into electricity by using semiconductors that exhibit the photovoltaic effect. Solar photovoltaics is now, after hydro and wind power, the third most important renewable energy source in terms of globally installed capacity. Constructions of these solar cells are based around the concept of a p-n junction, wherein photons from the solar radiation are converted into electron-hole pairs. Examples of semiconductors used for commercial solar cells include monocrystalline silicon, polycrystalline silicon, amorphous silicon, cadmium telluride, and copper indium gallium diselenide. Solar cell energy conversion efficiencies for commercially available cells are currently reported to be around 14-22%.

High conversion efficiency, long-term stability and low-cost fabrication are essential for commercialization of solar cells. For this reason, a wide variety of materials have been researched for the purpose of replacing conventional semiconductors in solar cells. For example, the solar cell technology using organic semiconductors is relatively new, wherein these cells may be processed from liquid solution, potentially leading to inexpensive, large scale production. Besides organic materials, organometal halide perovskites, for example, $CH_3NH_3PbX_3$, where X=Cl, Br, I, or a combination thereof, have recently emerged as a promising material for the next generation of high efficiency, low cost solar technology. It has been reported that these synthetic perovskites exhibit high charge carrier mobility and lifetime that allow light-generated electrons and holes to move far enough to be extracted as current, instead of losing their energy as heat within the cell. These synthetic perovskites can be fabricated by using the same thin-film manufacturing techniques as those used for organic solar cells, such as solution processing, vacuum evaporation techniques, etc.

Recent reports have indicated that this class of materials, i.e., organometal halide perovskites, have potential for high-performance semiconducting media in optoelectronic devices as well. In particular, some perovskites are known to exhibit strong photoluminescence properties, making them attractive candidates for use in light-emitting diodes (LEDs). Additionally, it has been reported that perovskites also exhibit coherent light emission properties, hence optical amplification properties, suitable for use in electrically driven lasers.

However, to date, it has been difficult to obtain highly uniform perovskite films with good stoichiometry based on the existing fabrication techniques. Furthermore, these existing techniques are not robust enough for fabricating perovskite films for bandgap engineering, multi-junction or Tandem cell fabrication, doping control, heterostructure construction, and other advanced solar cell and optoelectronics applications. In view of ever increasing needs for low cost fabrication techniques of high-performance devices, a new fabrication technique is desired for producing highly uniform perovskite films suitable for solar cell and optoelectronics applications including LEDs and lasers.

CITATION LIST

Non Patent Literature

NPL1: Guichuan Xing et al., Low-temperature solution-processed wavelength-tunable perovskites for lasing. Nature Materials Vol. 13, 476-480 (March, 2014).

NPL2: Zhi-Kuan Tan et al., Bright light-emitting diodes based on organometal halide perovskite. Nature Nanotechnology Vol. 9, 687-692 (September, 2014).

NPL3: Giles E. Eperon et al., Formamidinium lead trihalide: a broadly tunable perovskite for efficient planar heterojunction solar cells. Energy Environ. Sci. 7, 982-988 (2014).

NPL4: Qi Chen et al., Planar heterojunction perovskite solar cells via vapor-assisted solution process. J. Am. Chem. Soc.136, 622-625 (2014).

NPL5: Qi Chen et al., Planar heterojunction perovskite solar cells via vapor-assisted solution process. Supporting Information, J. Am. Chem. Soc.136, 622-625 (2014).

NPL6: Mingzhen Liu et al., Efficient planar heterojunction perovskite solar cells by vapour deposition. Nature Vol. 501, 395-398 (2013).

NPL7: Nam-Gyu Park, Organometal perovskite light absorbers toward a 20% efficiency low-cost solid-state mesoscopic solar cell. J. Phys. Chem. Lett. 4, 2423-2429 (2013).

NPL8: Julian Burschka et al., Sequential deposition as a route to high-performance perovskite-sensitized solar cells. Nature Vol. 499, 316-320 (July, 2013).

SUMMARY

A system and method for fabricating a perovskite film is provided, the system including a housing for use as a CVD furnace having first and second sections coupled with first and second temperature control units, respectively. The first and second sections correspond substantially to the upstream and downstream of gases, respectively. One or more substrates are loaded in the second section and controlled by the second temperature control unit, and an evaporation unit containing an organic halide material is loaded in the first section and controlled by the first temperature control unit. Each of the substrates is pre-deposited with a metal halide material. The inside of the housing is pumped down to a low pressure. The organic halide gas is carried by an inert gas inputted through an inlet portion of the housing, moves toward the substrates, and reacts with the metal halide material to form a perovskite film on each of the substrates.

BRIEF DESCRIPTION OF DRAWINGS

FIG. 1 illustrates a unit cell of an organometal halide perovskite structure. (See NPL3.)

FIG. 2 illustrates an example of the system configuration for fabricating a perovskite film according to an embodiment.

FIG. 3 illustrates an example of the system configuration for fabricating a doped perovskite film according to an embodiment.

FIG. 4 illustrates an example of the process for fabricating a perovskite film based on the present system and method.

FIG. 5 illustrates an example of the process for fabricating a doped perovskite film based on the present system and method.

FIG. 6 illustrates an example of the solar cell fabrication process using the ITO or FTO as part of the substrate.

FIG. 7 shows a plot of the J-V curve representing the photovoltaic device characterization of a solar cell including the $MAPbI_xCl_{3-x}$ perovskite film grown by using the present system and method.

FIG. 8 shows a photo showing the atomic force microscopy (AFM) image of the $MAPbI_xCl_{3-x}$ perovskite film grown on a silicon substrate by using the present system and method.

FIG. 9 shows a plot of the X-ray diffraction (XRD) spectrum of the $MAPbI_xCl_{3-x}$ perovskite film grown by using the present system and method.

FIGS. 10A and 10B illustrate some of the optical properties of the $MAPbI_xCl_{3-x}$ perovskite film grown by using the present system and method.

FIG. 11 illustrates the solar cell structure including FA lead trihalide perovskite.

FIG. 12 illustrates the configuration for growing a FA lead trihalide perovskite film by using the present system and method.

FIG. 13 shows plots of X-ray diffraction (XRD) spectra of FAI powder and perovskite samples.

FIG. 14 shows plots of representative J-V curves from three batches, i.e., undersaturated, saturated and oversaturated batches.

FIG. 15 illustrates LED Structure A fabricated including the perovskite film.

FIG. 16 illustrates LED structure B fabricated including the perovskite film with mesoporous alumina.

FIG. 17 shows plots of photoluminescence intensity as a function of time for four different samples.

FIG. 18 shows a plot of electroluminescence intensity as a function of wavelength.

DESCRIPTION OF EMBODIMENTS

In view of ever increasing needs for low cost fabrication techniques of high-performance devices, this document describes a new fabrication system and method for producing highly crystalline, substantially uniform perovskite films for a wide variety of applications, such as solar cells and optoelectronics devices including LEDs and lasers. The low-pressure chemical vapor deposition (LP-CVD) is a type of chemical vapor deposition (CVD) performed at sub-atmospheric pressures. In general, gaseous precursors are transported through a reduced pressure environment in the LP-CVD, which affords relatively low equipment cost and operating expenses. The present fabrication process may be characterized as a modified low-pressure chemical vapor deposition (MLP-CVD), wherein temperatures for different source materials are independently controlled in a CVD tube furnace to optimize the growth of perovskite films. Scaling up the present system and method is possible for large-scale fabrication. Source materials for fabricating a perovskite film include halide materials such as $PbCl_2$, $PbBr_2$, $PbI_2$, $SnCl_2$, $SnBr_2$, $SnI_2$ and the like, and methylammonium ($MA=CH_3NH_3^+$) compounds such as $CH_3NH_3Cl$, $CH_3NH_3Br$, $CH_3NH_3I$, and the like. In place of, or in a combination with the MA compound, a formamidinium ($FA=HC(NH_2)_2^+$) compound can also be used. FIG. 1 illustrates a unit cell of an organometal halide perovskite structure. (See NPL3.) This is the orthorhombic structure having the general $ABX_3$ structure, in which an organic element, MA or FA, occupies each site A; a metal element, $Pb^{2+}$ or $Sn^{2+}$, occupies each site B; and a halogen element, $Cl^-$, $I^-$ or $Br^-$, occupies each site X. In this document, AX represents an organic halide compound having an organic element MA or FA for the A-cation combined with a halogen element Cl, I or Br for the X-anion; $BX_2$ represents a metal halide compound having a metal element Pb or Sn for the B-cation combined with a halogen element Cl, I or Br for the X-anion. Here, the actual element X in the AX and the actual element X in the $BX_2$ can be the same or different, as long as each is selected from the halogen group. For example, X in the AX can be Cl, while X in the $BX_2$ can be Cl, I or Br. Examples of implementations according to the present system and method are described below with reference to accompanying drawings.

FIG. 2 illustrates an example of the system configuration for fabricating a perovskite film according to an embodiment. The present system includes a housing 200, which serves as a CVD furnace to heat materials therein at a low pressure during deposition. The housing 200 may be viewed as having a first section 201 and a second section 202. The housing 200 in this example has a shape of substantially a tube; however, the shape can be of substantially a hollow cylinder, a hollow polyhedron or other closed hollow structure that is longitudinally elongated, e.g., along the horizontal direction as in this example. The housing 200 has an internal surface and an external surface. The housing 200 has an inlet portion 204 and an outlet portion 208 for inputting and outputting gases, respectively. Although not shown in FIG. 2, the system includes a pump unit coupled to the outlet portion 208 of the housing 200 for pumping down the inside of the housing 200. The pressure inside the housing 200 during deposition is controlled to be at a low pressure, which typically is greater than 1 Pa and lower than the atmospheric pressure (~$10^5$ Pa). An evaporation unit 212 containing the organic halide source material AX is loaded in the first section 201 of the housing 200 for generating the AX gas. The evaporation unit 212 may be a crucible to contain the AX compound in the form of powder. One or more substrates 216 that are pre-deposited with the metal halide source material $BX_2$ are loaded in the second section 202 of the housing 200. Multiple substrates 216 are illustrated in this figure; however, the number of the substrates placed in the housing 200 may be one or more. Each of the pre-deposited substrates 216 may be made by using a solution method, a vacuum evaporation technique, a chemical vapor deposition technique or other suitable method for depositing the $BX_2$ onto the substrate. A first temperature control unit 214 and a second temperature control unit 218 are provided for the evaporation unit 212 and the one or more pre-deposited substrates 216, respectively. These temperatures are controlled independently. The first temperature control unit 214 is coupled to the first section 201 for controlling a first temperature for the AX; and the second temperature control unit 218 is coupled to the second section 202 for controlling a second temperature for the one or more substrates 216. The first temperature control unit 214 and the second temperature control unit 218 may include first and second heating elements, respectively, such as filaments or heating taps. The first temperature is controlled primarily for evaporation of the AX source material; and the second temperature is controlled primarily to control the substrate temperature during deposition. Each of the time durations of the first and second headings may be predetermined or adjusted during deposition. Each of the temperature control schemes may include a program for controlling the temperature and may be provided internal to the housing 200, or may be provided external to the housing 200 for enabling manual temperature control. The temperatures may be monitored with one or more thermocouples placed inside the housing 200. Temperature control and monitoring schemes as well as heating schemes may be variously configured depending on growth conditions, source materials and other factors. The film thickness may be monitored by a quartz-crystal microbalance, for example, and may additionally be measured by using a profilometer or an atomic force microscope.

In the configuration of FIG. 2, an inert gas such as Ar, $N_2$ and the like is inputted through the inlet portion 204 of the housing 200, moving along the direction indicated by the arrow 220, and carrying the AX gas as indicated by the arrow 224 toward the one or more substrates 216, each of which is pre-deposited with the $BX_2$. Thus, the first section 201 corresponds substantially to the upstream section, and the second section 202 corresponds substantially to the downstream section. The one or more substrates 216 are aligned so that the pre-deposited $BX_2$ films face the incoming direction of the gases from the first section 201. The orientation and the position of each substrate 216 may be adjusted according to variations in direction and speed of the gas flow from location to location and other relevant factors. The packing density of the substrates 216 can also be adjusted. The amount of AX deposited onto a substrate is dependent on a number of factors, such as the temperature and surface area of the evaporation unit 212 containing the AX powder, the duration of deposition, the position and orientation of each substrate, and the packing density of the multiple substrates within the housing 200. All of these factors can affect the growth and are configured to be adjusted in the present system and method for achieving optimal film growth. The chemical reaction between the AX gas and the pre-deposited $BX_2$ film thereby takes place on each of the substrates 216 to form a perovskite film. The excess AX gas and the inert gas are subsequently carried away through the outlet portion 208, as indicated by the arrow 228. The first temperature control unit 214 can be used to heat the evaporation unit 212 containing the AX material to a predetermined evaporation temperature, which may be in the range between 150° C. and 350° C. in the present method. The second temperature control unit 218 can be used to heat the one or more substrates 216 with the pre-deposited $BX_2$ films to a predetermined substrate temperature, which may be in the range between the room temperature and 170° in the present method.

In the standard LP-CVD, source materials are in the form of gases before entering the furnace. These two or more gases react with each other and are deposited onto the substrate surface; therefore, the film grows from the substrate surface toward the gas-phase space. In the present system and method, the organic halide material AX may be originally in the form of powder, converted to gas in the evaporation unit 212, emitted in the first section 201, and carried by the inert gas to reach the one or more substrates 216 in the second section 202. The metal halide source material $BX_2$ is already deposited on the substrates 216. Thus, the AX gas is carried by the inert gas flow towards the one or more substrates 216, lands on each of the substrates 216, and reacts with the $BX_2$ to form a perovskite compound on each of the substrates 216. Further reaction is effectuated via the diffusion of the AX molecules into the solid phase of the $BX_2$. Thus, the growth front moves from the surface of the $BX_2$ film through the $BX_2$ bulk toward the substrate surface, accompanying the gradual expansion in volume of the growing film.

The mechanism of the perovskite formation according to the present system and method may be considered based on two types of diffusion: gas-phase diffusion and bulk diffusion of the AX molecules. The diffusion constant Dg in the gas phase may be expressed as:

$$Dg \propto T_g^{2/3}/P, \quad \text{Eq. (1)}$$

where $T_g$ is the temperature of the gas phase, and P is the pressure in the housing 200. The diffusion constant Dg is inversely proportional to the pressure P. In the present system and method, the operation pressure can be varied between 1 Pa to 1 atmospheric pressure ($\sim 10^5$ Pa). Therefore, the diffusion constant is adjustable over a wide range, leading to flexibility in controlling the film growth. On the other hand, the diffusion constant Db in the bulk $BX_2$ may be expressed as:

$$Db \propto \exp(-Ea/k_B \cdot T_b), \quad \text{Eq. (2)}$$

where $T_b$ is the substrate temperature, $k_B$ is the Boltzmann constant, and Ea is the activation energy. The above expression of the bulk diffusion constant Db indicates that the higher the temperature $T_b$, the higher the diffusion rate. The film pre-deposited on the substrate has a metal halide $BX_2$ concentration gradient during deposition until it is converted to a perovskite, as expressed as:

$$j = -Db\left[\frac{\partial C}{\partial x}\right], \quad \text{Eq. (3)}$$

where C is the metal halide $BX_2$ concentration, and x is the coordinate along the direction of the growth from the surface of the $BX_2$ film through the $BX_2$ bulk toward the substrate surface.

It has been reported that solution processing techniques and their variations are utilized to grow perovskite films. Although a solution processing in general offers inexpensive means for growing perovskite films, the growth parameters typically involve only the temperature for heating the whole setup including a petridish and source materials contained therein. Thus, many unpredictable variations can occur during the growth, leading to issues related to reproducibility and/or quality. A solution processing typically includes annealing; there is an optimal annealing temperature T(anneal) for the perovskite conversion. When the growth temperature T is too low, it is difficult to obtain the complete conversion. On the other hand, if the growth temperature T is too high, the perovskite will not form properly or will decompose at a decomposition temperature T(decomp). If a certain species of the AX requires a very high temperature to evaporate for giving sufficient vapor pressure, it may be required to apply T. In some instances, this growth temperature T may already exceed the maximum temperature of formation or the decomposition temperature, giving T>T (decomp). In this case, a high-quality perovskite film may not form because of decomposition.

In marked contrast, the present system and method involves controls of at least the pressure P, the evaporation temperature $T_1$ for the AX source material in the evaporation unit 212, and the substrate temperature $T_2$ for the pre-deposited substrates 216 as parameters to optimize the film growth, offering flexibility and possibility of scaling-up based on the relatively simple and inexpensive LP-CVD setup. Here, the pressure P can be selected from a wide range between 1 Pa and 1 atmospheric pressure ($\sim 10^5$ Pa); and the temperatures $T_1$ and $T_2$ can be independently controlled for two different sources, i.e., AX and BX$_2$, respectively. Furthermore, the present system and method provides swift control of the flow speed by adjusting the inlet portion 204 to control the flow speed, and of the film composition by adjusting primarily the temperature T$_1$ for the AX evaporation. Such swift control can be used to modulate the deposition rate and optimize the film quality. The present perovskite formation is a chemical reaction depending on a variety of factors, including but not limited to: (i) the flow rate of the mixture of the inert gas and the AX gas, (ii) the percentage of the AX gas in the mixture, (iii) the bulk diffusion of the AX molecules through the bulk BX$_2$ on top of the unreacted BX$_2$, (iv) mechanical properties during the perovskite formation accompanied with expansion in volume, and (v) the substrate temperature T$_2$ and the orientation of each substrate pre-deposited with the BX$_2$. In view of these complications associated with the perovskite formation, one of ordinary skill in the art would appreciate that reproducibility and optimization require highly adjustable process control, as afforded by the present system and method.

The present system and method can be configured to fabricate doped perovskite films. It has been reported that undoped (or unintentionally doped) perovskites are mostly n-type. Thus, successful synthesis of p-type perovskites can lead to the p-n junction formation for a perovskite solar cell. The p-type perovskite may be generally expressed as D p-doped ABX$_3$, where D is a dopant material such as the volatile I$_2$ or the non-volatile Bi(NO$_3$)$_3$, BiX$_3$, and the like. These dopants provide free holes when incorporated in the ABX$_3$ structure. To intentionally n-dope a perovskite film, n-type dopant materials E can be used, where E=methylammonium (MA), formamidinium (FA), Pb, InX$_3$, and the like. These dopants provide free electrons when incorporated in the ABX$_3$ structure to give E n-doped ABX$_3$.

FIG. 3 illustrates an example of the system configuration for fabricating a doped perovskite film according to an embodiment. This system includes the same system as illustrated in FIG. 2, further including a second evaporation unit 300 coupled to the inlet portion 204. An example of the second evaporation unit 300 may include an ampule 304 to contain the dopant material, and a heating element 308 provided to heat the ampule 304, hence the dopant, to generate its gas. The temperature of the heating element 308 is controlled to adjust the evaporation of the dopant material. The second evaporation unit 300 illustrated in FIG. 3 further includes a duct 312 coupled to the inlet portion 204 to guide the dopant gas flow into the housing 200. Thus, in the housing 200, the AX gas is carried by the flow of the mixture of the inert gas and the dopant gas toward the substrates 216, and the AX gas and the dopant gas react with the BX$_2$ to form a doped perovskite compound on each of the substrates 216. The duct 312 is coupled to a valve 316 to control the partial pressure of the dopant gas in the inert gas for adjusting the dopant gas flow and hence the doping concentration.

FIG. 4 illustrates an example of the process for fabricating a perovskite film based on the present system and method. In any of the fabrication processes based on the present system and method, the order of some of the steps may be changed, combined or separated for ease and convenience and for optimally carrying out the film growth. As illustrated in FIG. 2, the system includes the housing 200 for use as a CVD furnace, having the inlet portion 204 and the outlet portion 208 for inputting and outputting gases, respectively. The housing 200 may be viewed as having the first section 201 and the second section 202, which correspond substantially to the upstream and downstream sections of the gases, respectively. In step 404, one or more substrates 216 are loaded in the second section 202, wherein each of the one or more substrates 216 is pre-deposited with the metal halide material BX$_2$. The pre-deposition of the BX$_2$ on each substrate may be made by using a solution method, a vacuum evaporation technique, a chemical vapor deposition technique or other suitable method. In step 408, the evaporation unit 212 containing the organic halide material AX is loaded in the first section 201. In step 412, the inside of the housing 200 is pumped down to a low pressure in a range between 1 Pa and 1 atmospheric pressure (~10$^5$ Pa). In step 416, the second temperature T$_2$ is controlled via the second temperature control unit 218. Here, controlling the second temperature T$_2$ includes heating the one or more substrates. The time duration may be predetermined and/or adjusted during deposition. In step 420, the first temperature T$_1$ is controlled via the first temperature control unit 214. Here, controlling the first temperature includes heating the AX for evaporating the AX to generate the AX gas. The time duration may be predetermined and/or adjusted during deposition. In step 424, the inlet portion 204 is adjusted to input the inert gas such as Ar, N$_2$ and the like into the housing 200. The vapor pressure may be predetermined and/or adjusted during deposition. Once equilibrium is reached, the pressure and the inert gas flow may be substantially unchanged throughout the deposition. The organic halide material AX may be originally in the form of powder, converted to gas in the evaporation unit 212, and emitted in the first section 201. The metal halide source material BX$_2$ is pre-deposited on each of the substrates 216. Thus, the AX gas is carried by the inert gas flow toward the substrates 216, lands on each of the substrates 216, and reacts with the BX$_2$ to form a perovskite compound on each of the substrates 216. Further reaction is effectuated via the diffusion of the AX molecules in the solid phase of the BX$_2$. Thus, the growth front moves from the surface of the BX$_2$ film through the BX$_2$ bulk toward the substrate surface, accompanying the gradual expansion in volume of the growing film. In step 428, the process is completed when the BX$_2$ is converted to the perovskite compound.

As described in detail later, the perovskite formation process is reversible, in that a perovskite film oversaturated with AX can turn back to the perovskite film saturated with a right amount of AX, after the heating element for the AX is turned off. Typically, it is difficult to precisely control the amount of deposited AX on the substrate. To circumvent this problem, the reversibility can be utilized in the fabrication process. For example, step 420 for adjusting the first temperature for the AX may be modified to include: (i) heating the AX for evaporation for a predetermined duration of time, and (ii) turning off the heating to allow desorption of the AX from the perovskite film oversaturated with AX, thereby promoting a reversing process of turning the perovskite film oversaturated with AX to the perovskite film saturated with a right amount of AX. Based on this self-limiting desorption process, perovskite formation can be completed despite variations in saturation.

FIG. 5 illustrates an example of the process for fabricating a doped perovskite film based on the present system and method. Referring back to FIG. 3, the system further includes the second evaporation unit 300 coupled to the inlet portion 204, wherein the second evaporation unit 300 contains the dopant material. The process of fabricating a doped perovskite film is similar to the process of fabricating a perovskite film, such as illustrated in FIG. 4, up to step 424. After step 424, the process may proceed to step 504 in FIG. 5, where a third temperature T$_3$ associated with the second evaporation unit 300 is controlled to adjust the evaporation of the dopant material. In step 508, the valve 316 of the second evaporation unit 300 is adjusted to control the partial pressure of the dopant gas in the inert gas. In the housing 200, the AX gas is carried by the flow of the mixture of the inert gas and the dopant gas toward the substrates 216, and the AX gas and the dopant gas react with the $BX_2$ to form a doped perovskite compound on each of the substrates 216. Thus, the growth front moves from the surface of the $BX_2$ film through the $BX_2$ bulk toward the substrate surface, accompanying the gradual expansion in volume of the growing film. In step 512, the process is completed when the $BX_2$ is converted to the doped perovskite compound.

In any of the fabrication processes based on the present system and method, such as those exemplified in FIGS. 4 and 5, the order of some of the steps may be changed, combined or separated for ease and convenience and for optimally carrying out the film growth. For example, in FIG. 4, controlling the evaporation temperature $T_1$ and controlling the substrate temperature $T_2$ may be reversed in order, or carried out simultaneously. In another example, adjusting the valve of the second evaporation unit 300 to control the partial pressure of the dopant gas in the inert gas may be carried out simultaneously with adjusting the inlet portion 204 to input the inert gas into the housing 200. These and other variations are possible depending on growth conditions, source materials and other factors.

Examples of substrate materials include: fluorine-doped tin oxide (FTO) glass with electron transport layer (ETL) such as $TiO_2$ compact layer or ZnO thin film; indium tin oxide (ITO) glass with hole transport layer (HTL) such as PEDOT:PSS and NiO, where PEDOT:PSS stands for poly (3,4-ethylenedioxythiophene) polystyrene sulfonate; flexible substrate, such as polyethylene terephthalate, with either ETL or HTL.

The present system and method can be integrated in the full process for fabricating solar cells. FIG. 6 illustrates an example of the solar cell fabrication process using the ITO or FTO as part of the substrate. In step (A), the substrate is prepared by forming the ITO or FTO layer on the glass base, and forming the ETL on the ITO or FTO layer. In step (b), the metal halide $BX_2$ layer is formed on the substrate by using a solution method, a vacuum evaporation technique, a chemical vapor deposition technique or other suitable method. In step (C), the present fabrication process is performed using the system illustrated in FIG. 3 to convert the $BX_2$ film to a perovskite film. For example, a $PbCl_2$ film with a thickness of about 70 nm can be pre-deposited on the substrate, and a perovskite film can be grown to be about 200 nm in thickness after MAI incorporation into the entire $PbCl_2$ film. In step (D), the HTL is formed on the perovskite film, and the metal layer is formed on the HTL to form an electrode.

Solar cells including $MAPbI_XCl_{3-X}$ perovskite were grown by having MAI and $PbCl_2$ as source materials by using the preset system and method. Some of the results are described below.

FIG. 7 shows a plot of the J-V curve representing the photovoltaic device characterization of a solar cell including the $MAPbI_XCl_{3-X}$ perovskite film grown by using the present system and method. The measurements of the J-V curve were carried out under a simulated AM1.5G solar irradiation of 100 mW/cm². This plot shows that the short circuit current density (Jsc) is 19.1 mA/cm², the open circuit voltage (Voc) is 0.93V, and the fill factor (FF) is 0.66. This sample has a power conversion efficiency (PCE) of about 11.8%.

FIG. 8 shows a photo showing the atomic force microscopy (AFM) image of the $MAPbI_XCl_{3-X}$ perovskite film grown on a silicon substrate by using the present system and method. The image with a scan size of 40×40 μm² is shown in true proportion, i.e., the AFM height has the same scale as the scanning area scale. The AFM image shows that the typical root-mean square (RMS) roughness of the film is about 18 nm, which is considered to be small, thereby indicating uniformity of the perovskite film grown by the present fabrication system and method.

FIG. 9 shows a plot of the X-ray diffraction (XRD) spectrum of the $MAPbI_XCl_{3-X}$ perovskite film grown by using the present system and method. This XRD spectrum shows the organometal halide perovskite characteristics having peaks at 14.04 and 28.42 degrees corresponding to the (110) and (220) planes of the orthorhombic structure. It should be noted that the peak (110) is stronger than the (220) peak even in the absence of annealing in the present process. Other peaks corresponding to (112), (211), (202), (312), (224), and (314) planes are also identified, indicating high crystallinity of the present perovskite film.

FIGS. 10A and 10B illustrate some of the optical properties of the $MAPbI_XCl_{3-X}$ perovskite film grown by using the present system and method. In FIG. 10A, a photo of the film with the background of a fluorescent light is shown. The color of the light transmitting through the film to naked eyes is orange red in this example. In FIG. 10B, a plot of absorbance of the perovskite film is shown. In general, total light intensity is determined by reflection, absorption and transmission. In the photo in FIG. 10A, the color is mainly determined by transmission. Supposing reflection is negligible, transmittance=total (100%)− absorbance. Therefore, the color in the photo can be represented by total (100%)− the absorbance plotted in FIG. 10B, assuming that the illumination from the fluorescent light provides white light, i.e., equal intensity for all wavelengths. These optical data indicate that the perovskite films are semi-transparent, and thus these films are a promising candidate for solar windows.

Details in process and results are described below for the case of fabricating solar cells including formamidinium (FA) lead trihalide, as another example using the present system and method.

FIG. 11 illustrates the solar cell structure fabricated in this example including FA lead trihalide perovskite. The substrate was prepared by forming a compact $TiO_2$ layer on a fluorine-doped tin oxide (FTO) glass. The $TiO_2$ layer was deposited via spray pyrolysis. A thin film of lead chloride $PbCl_2$ was formed on the substrate. The pre-deposited $PbCl_2$ on the substrate was converted to a perovskite layer $FAPbI_XCl_{3-X}$ via chemical reaction between FAI and $PbCl_2$ by using the present system and method. The perovskite layer was then spin-coated with a hole transport layer made of spiro-MeOTAD [2,2',7,7'-tetrakis(N,N-di-p-methoxyphenylamine)-9,9'-spirobifluorene], on top of which gold top contacts were formed by thermal evaporation. More specifics are described below.

FIG. 12 illustrates the configuration for growing a FA lead trihalide perovskite film using the present system and method. The pre-deposited substrate was prepared by depositing $PbCl_2$ up to a layer thickness of ~100 nm onto the $TiO_2$-coated substrate by thermal evaporation, at ~2.0×10² Pa, approximately 0.1 to 0.4 angstrom/s, using $PbCl_2$ powder. The film thickness was monitored by a quartz-crystal microbalance and additionally measured by using a profilometer or an atomic force microscope. Multiple substrates pre-deposited with $PbCl_2$ were loaded into the second zone of a CVD furnace, as individually labeled with A-E in FIG. 12, whereas the first zone was loaded with an evaporation unit containing ~1 g of solid FAI powder. In an example configuration, the distance between B and D was 6 cm. The CVD furnace was then evacuated and purged with dry nitrogen. The pre-deposited substrates were heated up to 160° C., and then the FAI powder was heated up to 180° C. The inlet portion of the CVD furnace was adjusted to input $N_2$ gas in the present case. Once equilibrium was reached, the internal pressure and the $N_2$ gas flow were substantially unchanged throughout the deposition process. Thus, the first section of the CVD furnace corresponds to the upstream section, and the second section of the CVD furnace corresponds to the downstream section. Typically, all FAI absorption occurs when the substrate is at ~160° C. This temperature was measured with a thermocouple placed inside the CVD furnace to guarantee a temperature measurement similar to the substrates. Total FAI sublimation time was approximately 30 min, where FAI was held at ~180° C. for ~6-16 min, and ~20 min was required for ramp up and cool down. The amount of FAI consumed was typically ~50 mg or less. The FAI temperature was allowed to cool below 160° C., and the substrate heating was turned off. Upon full saturation with FAI, the film thickness increased from 103±2 nm ($PbCl_2$) to 324±6 nm (perovskite) in one example.

Under these growth conditions, FAI deposition appears to be largely mass transport-limited, meaning that the rate of conversion from $PbCl_2$ to perovskite is limited by the amount of FAI transported to the substrate in the gas phase. The amount of FAI deposited onto a substrate is dependent on a number of factors, such as the temperature and surface area of the FAI evaporation unit, the duration of deposition, the position and orientation of each substrate, and the packing density of the substrates within the CVD furnace. All of these factors were observed to affect the growth and are configured to be controlled in the present CVD process. Position dependence was more noticeable at lower temperatures (e.g., 120° C.), where the substrates along the length of the CVD tube furnace develop a variety of colors despite having experienced the same nominal process. Samples at all positions (A-E in FIG. 12) transited all observed phases, as long as the CVD process was allowed to progress. Improved uniformity was observed at temperatures above ~145° C., due to inability of FAI to condense onto the sidewalls of the tube furnace. This prevents formation of steep concentration gradients of FAI vapor below its sublimation temperature (~145° C.). Therefore, it is possible to perform depositions on plastic substrates as long as the plastics maintain their integrity at the temperature used. Lower temperatures may require a temperature gradient, creating a reaction rate gradient that accommodates the concentration gradient. All devices were grown at ~160° C. to ensure that the substrates were at well above the FAI sublimation temperature and to maximize rates of reaction and crystal growth. Growth was monitored in situ and was recorded.

During the CVD growth, there are three possible phases of the perovskite film, depending on the amount of FAI deposited. First, $PbCl_2$ is mostly converted to lead iodide $PbI_2$. This is consistent with the fact that the sample was yellow in color, the appearance of an X-ray diffraction (XRD) peak at 12.6°, characteristic of $PbI_2$ XRD, and the X-ray photon spectroscopy (XPS) measurement of the lead to iodide ratio of approximately 2:1.

At higher concentrations of FAI, the film begins to form perovskite and turns from yellow to black. The XRD peaks were observed at 13.9°, 28.0°, and 31.5°. With enough FAI for complete conversion, the film appears red in color and the XRD peaks at 24.4° and 40.2° appear. These five peaks are characteristic of trigonal perovskite in the P3m1 space group. At this stage when the film turns red, there is a well-defined absorption edge at ~830±10 nm (~1.50 eV) in the ultraviolet-visible (UV-vis) spectrum.

With increasing FAI, the film becomes oversaturated. It transitions from red to yellow, and a new yellow crystal structure forms with XRD peaks at 9.9°, 15.7°, and 29.1°. Adding even more FAI causes the film to become comparatively opaque and creates new peaks at 18.0°, 25.7°, 27.0°, and 30.7°. In comparison, FAI powder measured by XRD was found to have prominent peaks at 18.5°, 25.8°, 36.5° and 44.4°. Based on the XRD and UV-vis results, at least two lead-FAI-based crystal structures other than perovskite, delta-phase perovskite, or bulk FAI can form during the CVD process. Note that the richness of FAI depends not only on the position and orientation of each sample and the packing density of the samples (e.g., A-E in FIG. 12) but also the duration of the CVD process.

The perovskite formation process is reversible, in that films in the oversaturated yellow phase transitioned back to the perovskite phase when the FAI heating element was turned off, and the substrate was kept at ~160° C. This reversibility makes the CVD process robust and easy to scale up, because it may be difficult to precisely control the amount of deposited FAI on the substrates over the entire length of the CVD tube. Based on the self-limiting desorption process, perovskite formation can be completed despite variations in saturation. A fourth batch was oversaturated with FAI. This growth was held at ~160° C. for 1 hour, which de-saturated the perovskite after the FAI heating element was turned off. This batch had an average PCE of 11.5±1.0%. A steady state measurement operating at 0.75 V was taken from the champion cell of this batch and gave a current density of 15 $mA/cm^2$, corresponding to a PCE of 11.3%. Thus, in this case, the efficiency of the devices using reversed/desorbed perovskite films is found to be slightly lower than those using the saturated films (i.e., perovskite films with the right amount of FAI). However, reversed/desorbed perovskite films can be reproducibly grown with reasonable device performance, and hence it is believed that such reversed/desorbed perovskite films are suitable for certain industrial applications.

As mentioned earlier, this reversibility can be utilized in the fabrication process. Referring back to the process illustrated in FIG. 4, step 420 for controlling the first temperature for the AX may be modified to include: (i) heating the AX for evaporation for a predetermined duration of time, and (ii) turning off the heating to allow desorption of the AX from the perovskite film oversaturated with AX, thereby promoting a reversing process of turning the perovskite film oversaturated with AX to the perovskite film saturated with a right amount of AX.

FIG. 13 shows plots of X-ray diffraction (XRD) spectra of FAI powder and perovskite samples. From top to bottom, the spectra of FAI powder, highly oversaturated sample, oversaturated sample and reversed/desorbed sample are plotted. The oversaturated sample was yellow, and has the XRD peaks at 9.9°, 15.7°, and 29.1°. The FAI powder has the characteristic XRD peaks at 18.5°, 25.8°, 36.5° and 44.4°. The highly oversaturated sample was yellow but comparatively opaque, and has the XRD peaks at 18.0°, 25.7°, 27.0°, and 30.7°. The reversed/desorbed perovskite film, which was formed via the process including a period after turning off the FAI heating element, returned to black in color, and has the XRD peaks at 13.9°, 28.0°, and 31.5°, characteristic of a perovskite structure.

As mentioned earlier, under low temperature conditions there is a gradient in the FAI vapor concentration along the length of the CVD tube. Samples have progressively less FAI deposited with increasing distance from the FAI source (from E to A in FIG. 12). XPS was performed to confirm that sample E has more FAI than sample A. From the XPS spectrum, it is possible to measure the relative ratios of iodine and nitrogen relative to lead. Because all nitrogen in the samples comes from FAI, the gradient in the FAI concentration in samples E-A can be confirmed by XPS results. The FAI concentration is considered to be primarily responsible for the different phases.

Five representative batches of solar cells were fabricated, each with variable FAI deposition and heating times. These batches represent differing levels of FAI absorbed into the perovskite film, or levels of "saturation." The degree of saturation was determined by monitoring the growth in situ. In the first batch, the FAI heating element was kept at ~180° C. for a short time, and consequently this batch is believed to have been slightly undersaturated with FAI, and devices fabricated had an average PCE of 10.5%±0.7%. To test the roles of packing density and orientation, FTO glass substrates were loaded vertically, otherwise the CVD process was kept the same. This batch had a lower average PCE of 7.8%±1.3%, which is likely due to being highly undersaturated with FAI. This suggests that FAI deposition depends on how substrates are loaded; tightly packed substrates take a longer time to convert to perovskite than loosely packed substrates.

A third batch was controlled by watching the color and reducing the applied heat when the substrates appeared to be saturated. This batch was completely saturated, but did not turn yellow, and showed the highest batch average PCE of 13.0%±0.2%. Thus, it is believed that there is an optimal level of FAI saturation for device performance.

FIG. 14 shows plots of representative J-V curves from three batches, i.e., undersaturated, saturated and oversaturated batches. Changes in the saturation level impact the fill factor (FF) and the short circuit current density (Jsc) in addition to the PCE. These curves represent the batch averages, not the highest performance. The saturated samples exhibited the highest batch average PCE of 13.0%, FF of 62, and Jsc of 21.6 mA/cm².

A batch with high oversaturation was fabricated with an area of 1 cm² and showed efficiencies as high as 7.7%. This efficiency was measured after 4 days of air exposure without encapsulation, which shows promise for long-term stability (~23° C. and 40-50% relative humidity). The completed device (i.e. with Au top electrodes) was uniform in color and semitransparent, demonstrating that perovskite solar cells made with the present CVD process are compatible for applications such as solar windows.

Temperature stability is important for all solar cells because they are required to operate under the heat of the sun. It is especially important for the CVD process because perovskite is grown at relatively high temperatures. It has been reported that FAI has greater thermal stability than MAI. A test of MAI and FAI based perovskite films grown by CVD shows that the decay rate at 120° C. in air appears to be slower for FAI. In this test, samples were left on a hot plate at 120° C. in air with ~50% relative humidity. The MAI sample started to decay at the edges after 6 h, while the FAI sample showed no sign of decay. After 17 h, the MAI sample nearly completely decayed, while the FAI sample showed signs of decay but maintained a dark color.

In another test, devices based on the samples from the oversaturated growth were stored in a nitrogen glovebox between measurements. The devices were found to be stable up to 155 days. The highest efficiency measurement of 14.2% was taken 42 days after fabrication. Thus, it was found that the cells do not decay considerably with time in an inert environment, suggesting possibility of obtaining stable cells with proper encapsulation. After 155 days, the average efficiency increased from 11.3% to 11.8%. This slight increase in efficiency may be due to the improved charge transport properties of spiro-MeOTAD induced by air exposure.

In yet another example, LED devices are fabricated based on perovskite films grown by using the present system and method. Details in process and results are described below.

Figure 15:
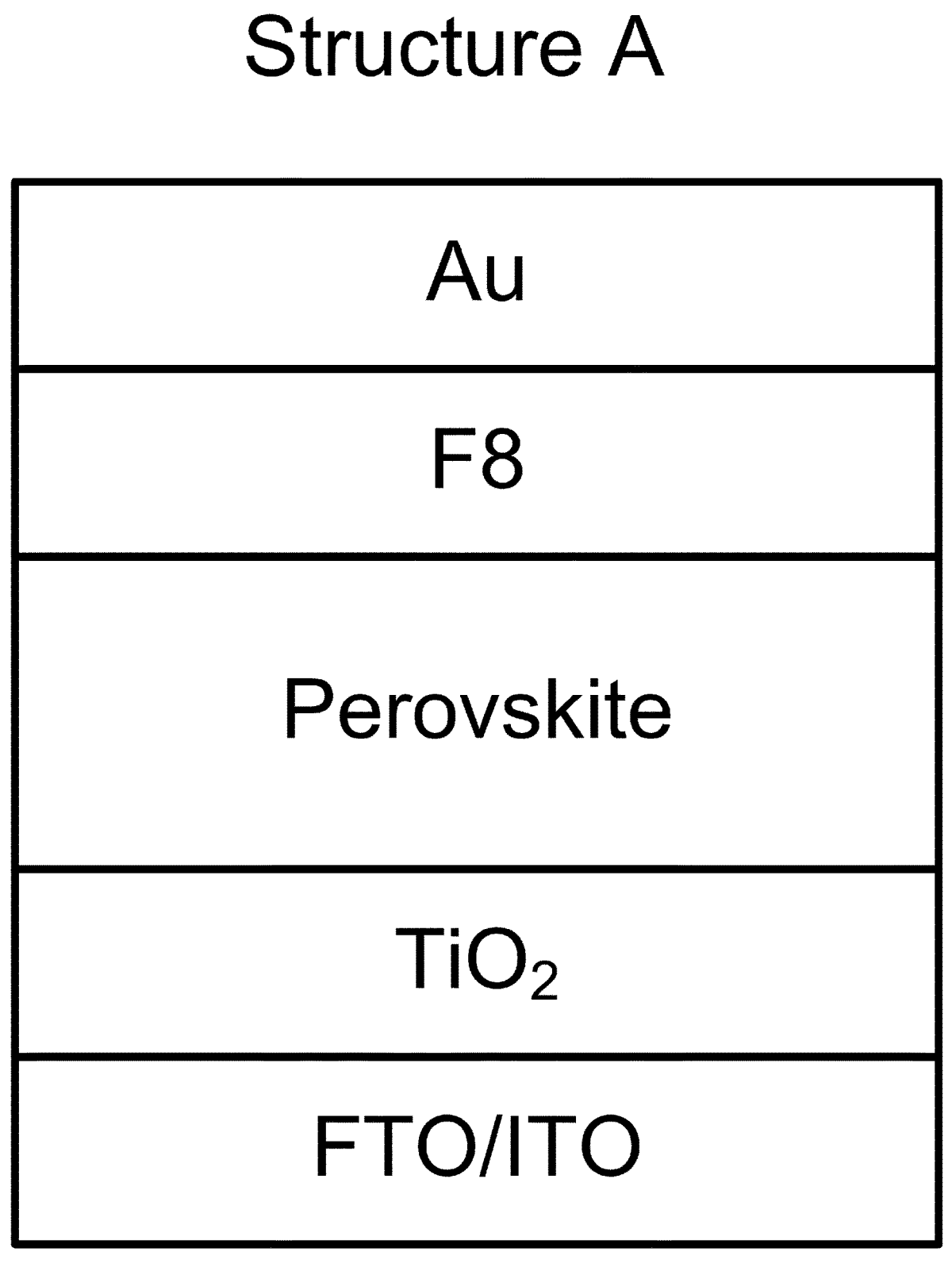

FIGS. 15 and 16 illustrate two LED structures, respectively, fabricated including perovskite. MAPbBr$_3$ was grown as the perovskite layer in Structure A illustrated in FIG. 15, whereas MAPbBr$_3$ with mesoporous alumina was grown in Structure B illustrated in FIG. 16. In both Structures A and B, a TiO$_2$ film was formed with a thickness of about 60 nm on a fluorine-doped tin oxide (FTO) glass substrate by spray pyrolysis. Alternatively, an indium tin oxide (ITO) glass can be used for a substrate, onto which TiO$_2$ may be sputtered. In both Structures, the perovskite layer was spin-coated with an F8 [poly(9,9'-dioctyl-fluorene] layer, on top of which gold top contacts were formed. Thus, in the LED devices considered herein, the perovskite emitter is sandwiched between large-bandgap TiO$_2$ and F8 layers, effectively confining electrons and holes in the perovskite layer for radiative recombination.

To form the perovskite layer in Structure A, PbBr$_2$, was pre-deposited on the TiO$_2$-coated substrate by vacuum evaporation. The thickness was about 22-30 nm in the present example. One or more substrates pre-deposited with PbBr$_2$ were then placed in the second section (i.e., downstream section) of the CVD furnace. An evaporation unit containing MABr powder was placed in the first section (i.e., upstream section) of the CVD furnace. The fabrication process proceeds as explained earlier with reference to FIG. 4. During the present process, PbBr$_2$ on the substrate reacts with MABr to form MAPbBr$_3$ perovskite. The resultant perovskite film thickness was ~50 nm in this example.

To form the perovskite layer with mesoporous alumina in Structure B, mesoporous alumina was first deposited on the TiO$_2$-coated substrate to form a layer of ~50 nm thick mesoporous alumina film in this example. Specifically, these mesoporous alumina films were prepared by diluting as-purchased solution by ~30 times in isopropyl alcohol (IPA), and then spin-coating at 3000 rpm. The substrate including the mesoporous alumina layer on the top was then pre-deposited with PbBr$_2$, by vacuum evaporation. The dimensions of the pores of mesoporous alumina are typically large enough for PbBr$_2$, molecules to permeate, and thus the PbBr$_2$ molecules are mostly deposited on the internal surfaces of the pores. That is, the substrate pre-deposited with PbBr$_2$ includes mesoporous alumina impregnated with the PbBr$_2$. One or more substrates pre-deposited with PbBr$_2$ were then placed in the second section (i.e., downstream section) of the CVD furnace. An evaporation unit containing MABr powder was placed in the first section (i.e., upstream section) of the CVD furnace. The fabrication process proceeds as explained earlier with reference to FIG. 4. During the present process, PbBr$_2$ in the pores of the mesoporous alumina layer reacts with MABr to form the MAPbBr$_3$ perovskite within the mesoporous alumina layer. Thus, the film thickness of the resultant perovskite with mesoporous alumina remains roughly the same, ~50 nm in this example.

Upon comparing fluorescent microscopic images of the device using Structure A and of the device using Structure B, it is found that the incorporation of the mesoporous alumina increases fluorescent intensity.

FIG. 17 shows plots of photoluminescence intensity as a function of time for four different samples without the F8 layer and Au contacts. The four different samples represent $MAPbBr_3$ on sputtered $TiO_2$, $MAPbBr_3$ on sprayed $TiO_2$, $MAPbBr_3$ with mesoporous alumina on sputtered $TiO_2$, and $MaPbBr_3$ with mesoporous alumina on sprayed $TiO_2$, respectively. On the basis of the present time-resolved photoluminescence measurements, it is concluded that the results on various types of substrates show little difference, and that the photoluminescence exponential decay time constant is about 0.5 ns.

FIG. 18 shows a plot of electroluminescence intensity as a function of wavelength. The present electroluminescence measurements were performed using a spectroradiometer on a device including $MAPbBr_3$ with a thickness of ~50 nm grown on the $TiO_2$ layer having a thickness of ~60 nm, sputtered on the ITO glass. A prominent peak is observed at ~530 nm.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

The invention claimed is:

1. A system for fabricating a perovskite film, the system comprising:
a housing for use as a furnace, the housing having a closed hollow structure elongated longitudinally,
an inlet portion and an outlet portion on the housing, the inlet portion and the output portion being configured to input and output gases, respectively, and the inlet portion being configured to be adjusted for inputting a gas into the housing;
a single organic halide source, the single organic halide source being provided in an evaporation unit in a first section of the housing, and the evaporation unit being configured to generate an organic halide gas from the organic halide source;
one or more substrates provided in a second section of the housing, each of the one or more substrates being pre-deposited with a metal halide compound, the second section being downstream of the first section along a flow path of the gas in the housing;
a first temperature control unit coupled to the first section of the housing, the first temperature control unit being configured to control a first temperature for the organic halide source; and
a second temperature control unit coupled to the second section of the housing, the second temperature control unit being configured to control a second temperature for the one or more substrates pre-deposited with the metal halide compound,
wherein the evaporation unit is configured to generate the organic halide gas by evaporating the organic halide source at the first temperature without a chemical reaction between the organic halide source and the gas inputted into the housing.

2. The system of claim 1, wherein the inlet portion and the outlet portion are configured to input and output gasses respectively, so that the organic halide gas is carried by the gas inputted through the inlet portion, and moves toward the one or more substrates, and during deposition, the organic halide gas reacts with the metal halide compound to form a perovskite film on each of the one or more substrates.

3. The system of claim 1, further comprising:
a pump unit coupled to the outlet portion of the housing for pumping down the inside of the housing to a low pressure,
wherein the low pressure is in a range between 1 Pa and an atmospheric pressure.

4. The system of claim 1, wherein
the first temperature control unit comprises a first heating element configured to evaporate the organic halide source to generate the organic halide gas, and
the first temperature control unit is configured to control the first temperature to be in a range between 150° C. and 350° C.

5. The system of claim 1, wherein
the second temperature control unit comprises a second heating element configured to heat the one or more substrates, and
the second temperature control unit is configured to control the second temperature in a range between a room temperature and 170° C.

6. The system of claim 1, further comprising:
a second evaporation unit configured to contain a dopant material and which is coupled to the inlet portion, wherein a third temperature associated with the second evaporation unit is controlled to be suitable for generating a dopant gas,
wherein the inlet portion is configured to be adjusted to input the gas and the dopant gas into the housing, so that the organic halide gas is carried by the gas and the dopant gas, and moves toward the one or more substrates, and during deposition, the organic halide gas and the dopant gas react with the metal halide compound to form a doped perovskite film on each of the one or more substrates.

7. The system of claim 6, wherein
the second evaporation unit comprises a valve configured to control a partial pressure of the dopant gas in the gas to adjust the dopant gas flow.

8. The system of claim 1, wherein the organic halide source comprises an organic halide compound represented by the formula AX, in which A represents an organic element selected from the group consisting of methylammonium and formamidinium, and X represents a halogen selected from the group consisting of Cl, I, and Br,
wherein the metal halide compound is represented by the formula $BX_2$, in which B represents a metal element selected from the group consisting of Pb and Sn, and X represents a halogen selected from the group consisting of Cl, I, and Br, and
wherein the halogen in the organic halide compound is the same or different from the halogen in the metal halide compound.

9. The system of claim 1, wherein the first temperature control unit and the second temperature control unit are configured to control the first temperature and the second temperature, respectively, so that the one or more substrates are saturated or oversaturated with the organic halide source.

10. The system of claim 1,
wherein the one or more substrates are vertically arranged in the second section of the housing,
wherein each of the one or more substrates is pre-deposited with the metal halide compound only on one side facing the inlet portion, and
wherein the second section is downstream of the first section along the flow path of the gas in the housing.

11. The system of claim 1, wherein the first temperature control unit and the second temperature control unit independently control the first temperature and the second temperature.

12. The system of claim 1, wherein a packing density of the one or more substrates arranged in the second section is adjustable to control a deposition amount of an organic halide compound.

* * * * *